United States Patent
Goh et al.

(10) Patent No.: US 10,609,813 B2
(45) Date of Patent: Mar. 31, 2020

(54) CAPACITIVE INTERCONNECT IN A SEMICONDUCTOR PACKAGE

(71) Applicant: Intel Corporation, Santa Clara, CA (US)

(72) Inventors: Eng Huat Goh, Ayer Itam (MY); Min Suet Lim, Bayan Lepas (MY); Fern Nee Tan, Putra Place (MY); Khang Choong Yong, Puchong (MY); Jiun Hann Sir, Gelugor (MY)

(73) Assignee: Intel Corporation, Santa Clara, CA (US)

( * ) Notice: Subject to any disclaimer, the term of this patent is extended or adjusted under 35 U.S.C. 154(b) by 759 days.

(21) Appl. No.: 15/182,091

(22) Filed: Jun. 14, 2016

(65) Prior Publication Data

US 2017/0359893 A1    Dec. 14, 2017

(51) Int. Cl.
*H05K 1/14* (2006.01)
*H01L 23/498* (2006.01)
(Continued)

(52) U.S. Cl.
CPC ........... *H05K 1/0231* (2013.01); *H01G 4/228* (2013.01); *H01G 4/33* (2013.01); *H01L 21/4853* (2013.01); *H01L 23/49811* (2013.01); *H01L 23/50* (2013.01); *H05K 1/141* (2013.01); *H01G 4/1209* (2013.01); *H01L 23/49816* (2013.01); *H01L 23/49827* (2013.01); *H01L 23/49833* (2013.01); *H01L 2224/13111* (2013.01); *H01L 2224/13116* (2013.01); *H01L 2224/13147* (2013.01);
(Continued)

(58) Field of Classification Search
CPC ...... H05K 1/0231; H05K 1/141; H01L 23/50; H01L 23/49811; H01L 21/4853; H01L 23/49833; H01L 23/49816; H01L 23/49827; H01L 2224/16227; H01L 2224/16235; H01L 2924/19041; H01L 2924/15311; H01L 2924/19102; H01G 4/33; H01G 4/228
See application file for complete search history.

(56) References Cited

U.S. PATENT DOCUMENTS 5,945,725 A * 8/1999 Ishikawa ................. C30B 25/18
257/531
6,259,593 B1 * 7/2001 Moriwaki ............ B23K 35/262
361/303

(Continued)

*Primary Examiner* — Nathan Milakovich
(74) *Attorney, Agent, or Firm* — Eversheds Sutherland (US) LLP

(57) ABSTRACT

Capacitive interconnects and processes for fabricating the capacitive interconnects are provided. In some embodiments, the capacitive interconnect includes first metal layers, second metal layers; and dielectric layers including a dielectric layer that intercalates a first metal layer of the first metal layers and a second metal layer of the second metal layers. Such layers can be assembled in a nearly concentric arrangement, where the dielectric layer abuts the first metal layer and the second metal layer abuts the dielectric layer. In addition, the capacitive interconnect can include a first electrode electrically coupled to at least one of the first metal layers, and a second electrode electrically coupled to at least one of the second metal layers, the second electrode assembled opposite to the first electrode. The first electrode and the second electrode can include respective solder tops.

22 Claims, 9 Drawing Sheets

(51) Int. Cl.
*H01G 4/33* (2006.01)
*H01G 4/228* (2006.01)
*H01G 4/12* (2006.01)
*H05K 1/02* (2006.01)
*H01L 21/48* (2006.01)
*H01L 23/50* (2006.01)

(52) U.S. Cl.
CPC ............ *H01L 2224/16227* (2013.01); *H01L 2224/16235* (2013.01); *H01L 2224/32225* (2013.01); *H01L 2224/48227* (2013.01); *H01L 2924/0103* (2013.01); *H01L 2924/0105* (2013.01); *H01L 2924/01022* (2013.01); *H01L 2924/01028* (2013.01); *H01L 2924/01046* (2013.01); *H01L 2924/01047* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/15311* (2013.01); *H01L 2924/15724* (2013.01); *H01L 2924/15738* (2013.01); *H01L 2924/15747* (2013.01); *H01L 2924/15763* (2013.01); *H01L 2924/19041* (2013.01); *H01L 2924/19102* (2013.01); *H05K 2201/10015* (2013.01); *H05K 2201/10378* (2013.01); *H05K 2201/10734* (2013.01)

(56) References Cited

U.S. PATENT DOCUMENTS

| | | | | |
|---|---|---|---|---|
| 6,418,029 | B1* | 7/2002 | McKee | H05K 1/023 174/260 |
| 8,331,101 | B2* | 12/2012 | Aoki | H01L 25/105 361/763 |
| 8,593,825 | B2* | 11/2013 | Chen | H01L 23/64 257/296 |
| 10,304,799 | B2* | 5/2019 | Leuten | H01L 23/13 |
| 2006/0158863 | A1* | 7/2006 | Hsu | H01L 23/49816 361/760 |
| 2010/0265682 | A1* | 10/2010 | Martinez | H01L 23/49816 361/782 |
| 2011/0316119 | A1* | 12/2011 | Kim | H01G 2/065 257/532 |

\* cited by examiner

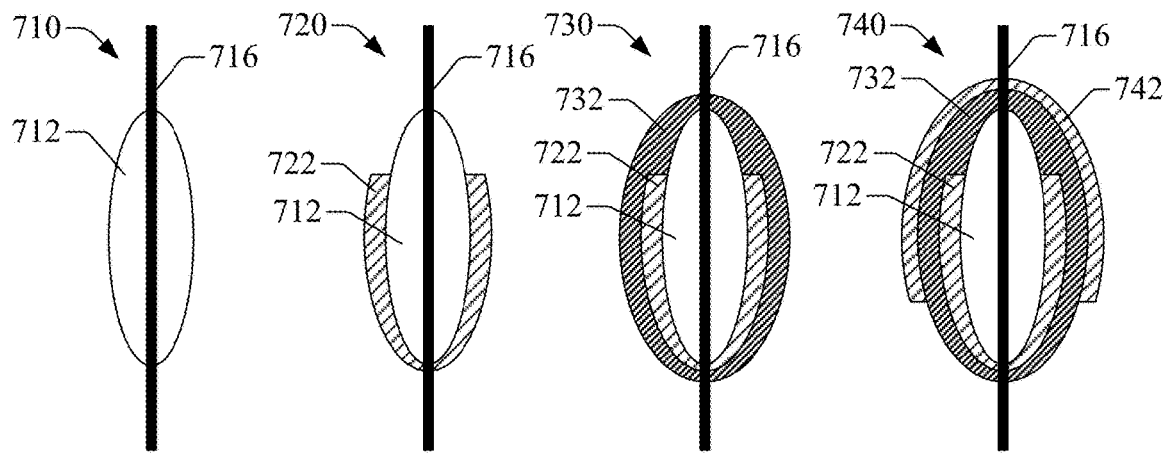
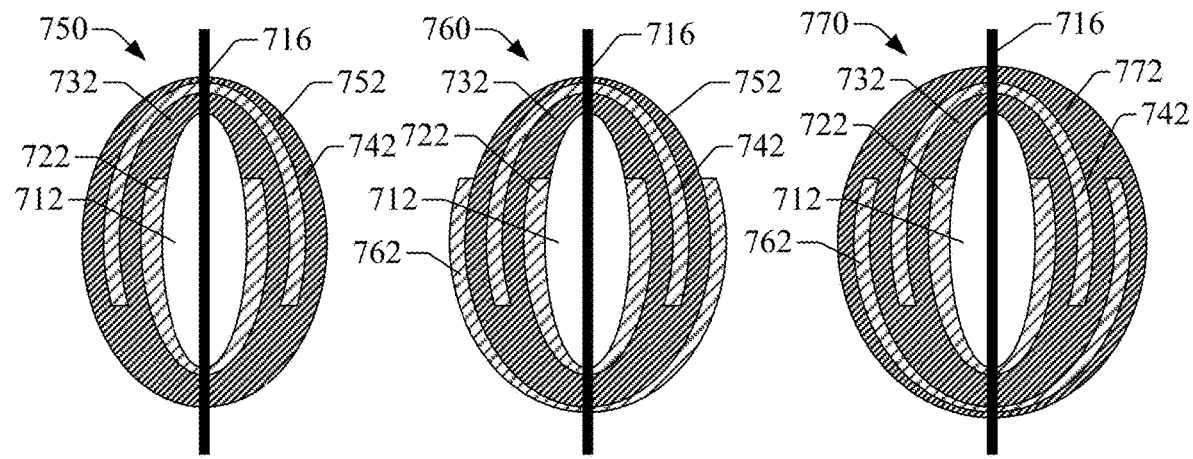
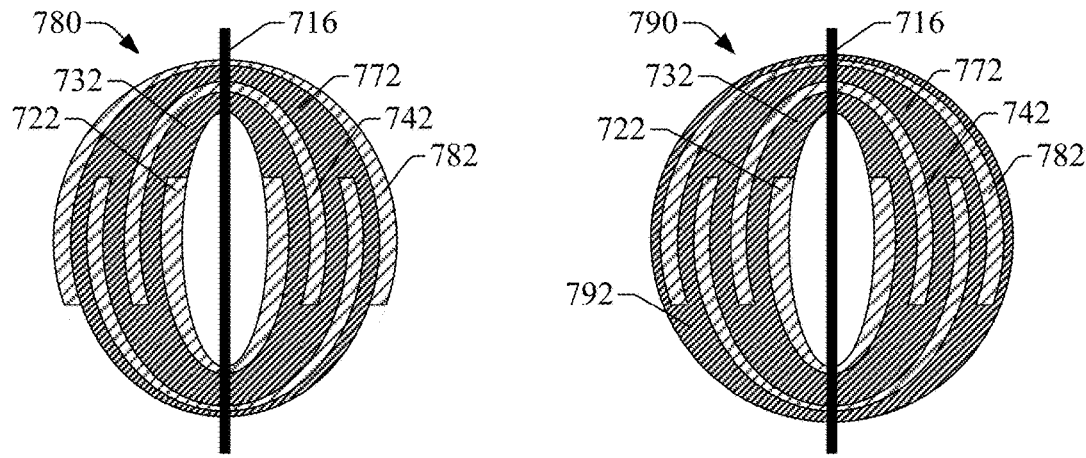
FIG. 7A  FIG. 7B  FIG. 7C  FIG. 7D
FIG. 7E  FIG. 7F  FIG. 7G
FIG. 7H  FIG. 7I

CAPACITIVE INTERCONNECT IN A SEMICONDUCTOR PACKAGE

BACKGROUND

Integrated circuits and other electronic components can be assembled in a semiconductor package. The semiconductor package may be integrated into an electronic system, such as a consumer electronic device. Such a system can consume power and, thus, it can be subject to electric noise and/or other interference issues. A common solution includes the assembly of decoupling capacitors that can permit a degree of electrical noise and/or interference isolation between a board substrate (such as a motherboard) and an integrated circuit (e.g., a CPU) in the semiconductor package. Although several options are available for decoupling capacitors (e.g., die side capacitors, land side capacitors, board edge capacitors, and board backside capacitors), package design and/or cost considerations can render some of those options non-viable. Therefore, much remains to be improved in the design of the arrangement of decoupling capacitors and real estate utilization in semiconductor product assemblies including semiconductor packages and/or substrates that support a semiconductor package.

BRIEF DESCRIPTION OF THE DRAWINGS

The accompanying drawings are an integral part of the disclosure and are incorporated into the subject specification. The drawings illustrate example embodiments of the disclosure and, in conjunction with the description and claims, serve to explain at least in part various principles, features, or aspects of the disclosure. Certain embodiments of the disclosure are described more fully below with reference to the accompanying drawings. However, various aspects of the disclosure can be implemented in many different forms and should not be construed as limited to the implementations set forth herein. Like numbers refer to like, but not necessarily the same or identical, elements throughout.

FIG. 5A illustrates an example of a multilayer ceramic capacitor in accordance with one or more embodiments of the disclosure;

FIG. 5B illustrates an example of encasing of the multilayer capacitor shown in FIG. 5A in accordance with one or more embodiments of the disclosure;

FIG. 5C illustrates an example of a treated multilayer capacitor in accordance with one or more embodiments of the disclosure;

FIG. 5D illustrates electrodes coupled to the treated multilayer capacitor shown in FIG. 5C in accordance with one or more embodiments of the disclosure; and FIG. 5E illustrates an example of a solder capacitive interconnect in accordance with one or more embodiments of the disclosure.

FIG. 6A illustrates an example of a ceramic core pierced by a metal wire in accordance with one or more embodiments of the disclosure;

FIG. 6B illustrates an example of a metal layer coating the ceramic core and a portion of the metal wire shown in FIG. 6A in accordance with one or more embodiments of the disclosure;

FIG. 6C illustrates an example of a metal coated ceramic core and wire resulting from treatment of the metal layer shown in FIG. 6B in accordance with one or more embodiments of the disclosure;

FIG. 6D illustrates an example of a dielectric layer that covers the metal coated ceramic core shown in FIG. 6C in accordance with one or more embodiments of the disclosure;

FIG. 6E illustrates an example of another metal layer coating the essentially concentric dielectric-metal multilayer shown in FIG. 6D;

FIG. 6F illustrates an example of another essentially concentric dielectric-metal multilayer resulting from treatment of the dielectric-metal multilayer shown in FIG. 6E in accordance with one or more embodiments of the disclosure;

FIG. 6G illustrates an example of yet another essentially concentric dielectric-metal multilayer in accordance with one or more embodiments of the disclosure;

FIG. 6H illustrates an example of yet another nearly concentric dielectric-metal multilayer in accordance with one or more embodiments of the disclosure; and FIG. 6I illustrates an example of the multilayer capacitor formed in accordance with one or more embodiments of the disclosure.

FIGS. 7A-7I illustrate schematic cross-sectional views representative of stages of another example process for forming a multilayer capacitor in accordance with one or more embodiments of the disclosure. Specifically, FIG. 7A illustrates an example of a ceramic core pierced by a metal wire in accordance with one or more embodiments of the disclosure;

FIG. 7B illustrates an example of a metal layer coating a portion of the ceramic core and another portion of the metal wire shown in FIG. 7A in accordance with one or more embodiments of the disclosure;

FIG. 7C illustrates an example of a dielectric layer that covers the metal coated ceramic core shown in FIG. 7B in accordance with one or more embodiments of the disclosure;

FIG. 7D illustrates an example of another metal layer coating the dielectric-metal bilayer shown in FIG. 7C;

FIG. 7E illustrates an example of an essentially concentric dielectric-metal multilayer resulting from treatment of the dielectric-metal bilayer shown in FIG. 7D in accordance with one or more embodiments of the disclosure;

FIG. 7F illustrates an example of yet another metal layer that covers the essentially concentric dielectric-metal multilayer of FIG. 7E in accordance with one or more embodiments of the disclosure;

FIG. 7G illustrates an example of yet another essentially concentric dielectric-metal multilayer in accordance with one or more embodiments of the disclosure;

FIG. 7H illustrates an example of a further metal layer that covers the essentially concentric dielectric-metal multilayer of FIG. 7G; and FIG. 7I illustrates an example of the multilayer capacitor formed in accordance with one or more embodiments of the disclosure.

FIG. 8A illustrates an example of a treated essentially concentric dielectric-metal multilayer in accordance with one or more embodiments of the disclosure.

FIG. 8B illustrates an example of another essentially concentric dielectric-metal multilayer resulting from treatment of the dielectric-metal multilayer shown in FIG. 8A in accordance with one or more embodiments of the disclosure.

FIG. 8C illustrates another example of yet another essentially concentric dielectric-metal multilayer in accordance with one or more embodiments of the disclosure.

FIG. 8D illustrates electrodes coupled to the nominally concentric dielectric-metal multilayer shown in FIG. 8C in accordance with one or more embodiments of the disclosure.

FIG. 8E illustrates an example of a solder capacitive interconnect resulting from treatment of the nominally concentric dielectric-metal multilayer shown in FIG. 8C.

DETAILED DESCRIPTION

Figure 1:
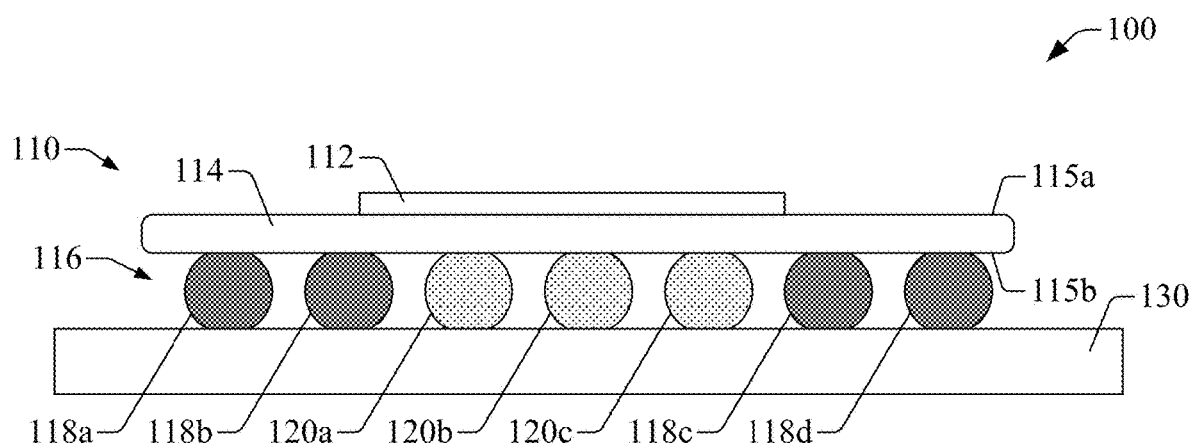
FIGS. 1-2 illustrate cross-sectional views of examples of product assemblies having respective semiconductor packages in accordance with one or more embodiments of the disclosure.

The disclosure recognizes and addresses, in at least certain aspects, the issue of real estate utilization in semiconductor packaging and/or substrates that support a semiconductor package. Accordingly, in one aspect, the disclosure provides capacitive interconnects and processes for fabricating the capacitive interconnects. The capacitive interconnects can operate as a decoupling capacitor and, thus, can substitute other types of decoupling capacitors commonly utilized in semiconductor product assemblies, such as board edge capacitors, land side capacitors, and the like. As described in greater below, the capacitive interconnects can be compactly assembled within a semiconductor package, efficiently utilizing available real estate on a board substrate onto which the semiconductor package can be mounted. In some embodiments, the capacitive interconnect can include first metal layers, second metal layers; and dielectric layers including a dielectric layer that intercalates a first metal layer of the first metal layers and a second metal layer of the second metal layers. Such layers can be assembled in a nearly concentric arrangement, where the dielectric layer abuts the first metal layer and the second metal layer abuts the dielectric layer. In addition, the capacitive interconnect can include a first electrode electrically coupled to at least one of the first metal layers, and a second electrode electrically coupled to at least one of the second metal layers, the second electrode assembled opposite to the first electrode. The first electrode and the second electrode can include respective solder tops. The capacitive interconnects can be utilized in a semiconductor package, providing a compact assembly that can reduce the utilization of real estate in a board substrate onto which the semiconductor package is mounted. As described in greater detail hereinafter, in certain embodiments, the disclosed solder capacitive interconnects can be formed via various treatments of one or more solid media.

Embodiments of this disclosure can provide several advantages over conventional packaging designs and implementation of decoupling capacitors. One example advantage includes providing more compact packaging designs, with ensuing greater packaging density. Specifically, in some embodiments, capacitors in a semiconductor package can be embodied in capacitive interconnects assembled or otherwise disposed under a package substrate, which can reduce the utilization of real estate on a substrate board beyond the surface directly opposite to the package substrate. Another example advantage includes positional flexibility of the capacitive interconnects within a group of conductive interconnects that couple the semiconductor package to the substrate board. Such flexibility can improve power delivery performance with respect to conventional semiconductor product packages. Without intending to be limited by modeling and/or design analysis, in some aspects, improved performance can arise from the increased flexibility in positioning a capacitive interconnect in proximity to power interconnects (e.g., solder bumps, metal pillars, and the like) that can provide power to a die included in a semiconductor package.

With reference to the drawings, FIG. 1 illustrates a cross-sectional view of an example of a product assembly 100 in accordance with one or more embodiments of the disclosure. The exemplified product assembly 100 can have a semiconductor package 110 that includes a die 112 that can be surface mounted to a package substrate 114. The package substrate 114 can be embodied in or can include a slab on which multiple semiconductor packages can be fabricated concurrently or nearly concurrently. The package substrate 114, in some aspects, can include interconnect build-up layers on either side of a core within the slab. In some embodiments a coreless slab may be utilized. As mentioned, the package substrate 114 can include pads for wire bonding provided thereon or another type of interconnect attachment that requires an electrical contact. The package substrate 114 can be fabricated of any rigid or flexible solid material, such as a plastic; a ceramic; composite materials (e.g., metal-ceramic composites, metal-plastic composite, or the like); glass; epoxy laminates of fiberglass sheets; FR-4 materials; FR-5 materials; combinations thereof, or the like. The core and/or the interconnect build-up layers also can be formed from one or a combination of such materials. In some embodiments, such layers may not be fabricated from the same material as the material utilized to fabricate the core of the package substrate 114.

With respect to the die 112, numerous types of interconnects (not depicted in FIG. 1) can permit surface mounting the die 112 to a first surface 115a of the package substrate 114. To that end, in some aspects, such interconnects can mechanically and/or electrically couple the die 112 to the package substrate 114 at conductive pads (e.g., metal pads or metallic pads) placed on a surface of the package substrate 114. In some embodiments, such interconnects can be embodied in or can include a ball grid array. The die 112 can include circuitry that can provide, at least in part, one or more functionalities (e.g., computing, navigation, sensing, a combination thereof, or the like). More specifically, the circuitry can embody or can include microprocessors, microcontrollers, application specific integrated circuits (ASICs), gate arrays, memory devices, digital signal processors (DSPs), programmable logic devices (PLDs), graphics chipsets and/or PC chipsets, a combination of the foregoing, or the like. In some embodiments, the die 112 also can include a microelectromechanical system (MEMS)—such as a movable diaphragm and a backplate in a microphone, a gyroscope or another type of solid-state accelerometer, and the like that also can permit or otherwise facilitate, at least in part, at least one of the one or more functionalities.

The semiconductor package 110 also includes interconnects 116 that can couple (mechanically and/or electrically) the package substrate 114 to a board substrate 130. The board substrate 130 is not included in the semiconductor package 110, and can be embodied in or can include a printed circuit board (PCB), a motherboard, or the like. In some embodiments, a first group of the interconnects 116 can be embodied in or can include a ball grid array (BGA). Thus, in one aspect, each interconnect of the first group of the interconnects 116 can be embodied in a solder ball in contact with a portion of the surface 115b, and further in contact with a second portion of a surface of the board substrate 130 opposite to the surface 115b. As such, in another aspect, the first group of the interconnects 116 can be embodied in solder balls assembled in respective positions within a grid having a defined pitch. The grid also can be referred to as a square point lattice. The pitch and/or the number of solder balls can be specific to the die 112 and, therefore, to the product assembly 100. In one example the pitch can be about 1.00 mm. In another example, the pitch can be about 1.27 mm. The number of solder balls (or ball count) can correspond to number of leads in the die 112, and can range from about 196 to about 615. Examples of ball count include about 196, about 208, about 241, about 256, about 304, about 324, about 352, about 421, about 432, about 468, about 492, about 540, about 544, and about 615. The solder balls can have substantially the same diameter (e.g., diameter variations from solder ball to solder ball can be about the feature or spatial resolution of the technique utilized to form the solder balls). Example diameters can include 400 µm, 600 µm, and 900 µm. It is noted that, within the semiconductor package 110, the diameter of a solder ball can correspond to the diameter of a cross-section of the ball at a mid-section plane parallel to the surface 115b. In the direction normal to the surface 115b, the height of a solder ball is referred to as package standoff. In some example, for the sake of nomenclature, the packages standoff can be labeled as $A_1$ (a real number) and can range from about 300 µm to about 700 µm (e.g., about 300 µm, about 400 µm, about 500 µm, about 560 µm, and about 700 µm). Each of the solder balls can be an electric conductor, and can be formed from or can include a lead-tin alloy or a lead-free eutectic alloy. Examples of the lead-tin alloy include a eutectic mixture of about 50% Sn and about 50% Pb, and another eutectic mixture of about 63% Sn and about 37% Pb. Examples of the lead-free alloy can include a gold-tin alloy or a gold-silicon alloy. In addition, the solder ball can have a defined height that determines the separation between the package substrate 114 and the board substrate 130. In some embodiments, planes parallel to the surface 115b define corresponding substantially circular cross sections of the solder ball. As an illustration, the first group of interconnects 116 can include a solder ball 118a, a solder ball 118b, a solder ball 118c, and a solder ball 118d.

Figure 2:
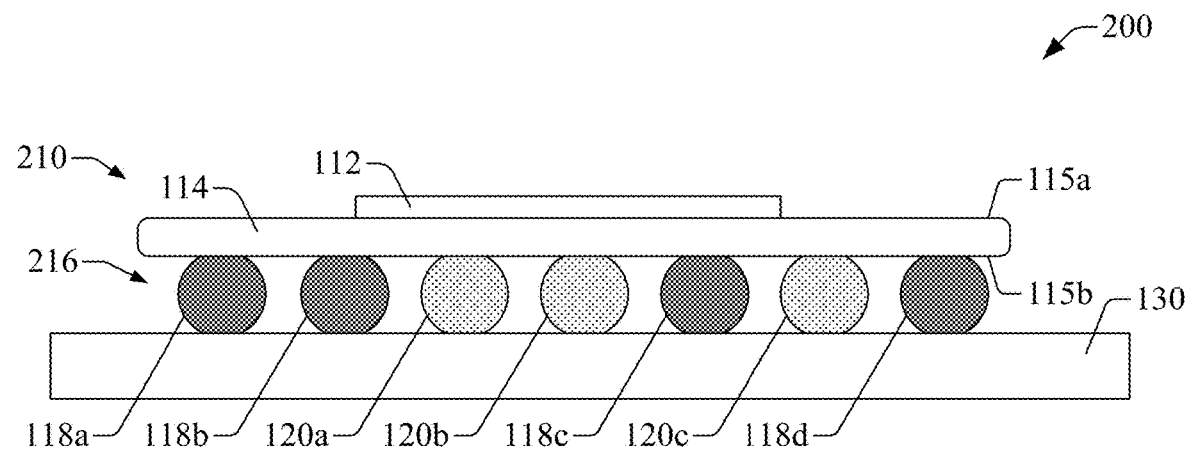

The interconnects 116 also can include at least one capacitor assembled at respective defined position(s) on the surface 115b of the package substrate 114. Therefore, the at least one capacitor may be referred to as capacitive interconnect(s). In some aspects, each of the at least one capacitor can serve as a decoupling capacitor between the semiconductor package 110 and the board substrate 130. In an embodiment in which a first group of the interconnects 116 embodies a BGA, the at least one capacitor can form a second group of the interconnects 116, each assembled at respective location(s) within a grid (or another type of lattice) associated with the BGA. As an illustration, the first group can include the solder balls 118a-118d, as described herein, and the second group can include a capacitive interconnect 120a, a capacitive interconnect 120b, and a capacitive interconnect 120c placed at respective positions within such a grid. The grid and associated location(s) for placement of the solder balls in the first group of the interconnects 116 and the at least one capacitor in the second group of the interconnects 116 can be specific to the die 112. For instance, the functionality, architecture, and/or power requirements of the die 112 can determine, at least in part, the type of such a grid and the associated location(s). For example, in some embodiments, such as that shown in FIG. 2, a product assembly 200 can include a semiconductor package 210 having interconnects 216, where the solder balls 118a-118d and the capacitive interconnects 120a-120c can be arranged in different positions on the substrate package 114. More generally, the positions at which the interconnects 116, or, in some embodiments, the interconnects 216 are not being limited to a positions within a grid, but rather at least a subset of the interconnects 116, or, in some embodiments, the interconnects 216, can be flexibly positioned according to one or more defined criteria (design, power requirements, etc.).

Regardless of specific positions of the interconnects 116, or, in some embodiments, the interconnects 216, such interconnects can be assembled under the package substrate 114, providing a compact assembly design. In some aspects, all capacitors are assembled or otherwise disposed under the package substrate 114 and, thus, do not occupy real estate on the substrate board 130 beyond the surface directly opposite to the surface 115b of the package substrate 114, as it would be the case for a board edge capacitor. As a result, in some aspects, the compact assembly of the interconnects 116, including capacitive interconnects, can permit reduced form-factor of the semiconductor package 110 with respect to conventional semiconductor packages. Specifically, in some product assemblies, the capacitive interconnects disclosed herein can permit avoiding the need for a cavity underneath the package substrate 114, thus permitting reclaiming (or recovering) about 48 solder balls in a BGA for other functions within the semiconductor package 110. In particular, in one of such product assemblies, 21 capacitors may be needed for operation of the product assembly, thus about 27 solder balls in the BGA can be recovered for other functionality. In addition, the compact assembly of the interconnects 116 (or, in some embodiments, the interconnects 216) can permit avoiding warpage that is commonly present in a semiconductor package having a large land-side capacitor (LSC) cavity at or near the center of the semiconductor package.

With further reference to FIG. 1, in some aspects, each of the at least one capacitor included in the interconnects 116 can have a first electrode coupled to a portion of the surface 115b and a second electrode coupled to a portion of the surface of the board substrate 130 opposite to the surface 115b. The at least one capacitor also can have, in some embodiments, one or more first metal layers coupled to the first electrode, one or more second metal layers coupled to the second electrode, and dielectric layers intercalated between the first metal layer(s) and the second metal layer(s). In one embodiment, a metal layer of the first metal layers can be formed from or can include copper, aluminum, tungsten, silver, gold, palladium, platinum, zinc, nickel, or an alloy of two or more of the foregoing. In addition or in other embodiments, a metal layer of the second metal layers can include copper, aluminum, tungsten, silver, gold, palladium, platinum, zinc, nickel, or an alloy of two or more of the foregoing. Regardless of the combination of metals that constitute the first metal layer(s) and the second metal layer(s), a dielectric layer of the dielectric layers can be formed from or can include, for example, ceramics (such as those utilized in Class 1 and Class 2 capacitors); a silicon oxide or another high-K material; a combination of the foregoing; or the like. High-K dielectric materials can include, for example, alumina; silicon monoxide (SiO, K of about 5.0); silicon dioxide (SiO$_2$, K of about 3.9); titanium dioxide; silicon nitride (SiO$_3$N$_4$, K of about 6); alkali halides (such as rubidium bromide (RbBr, K of about 4.7), lithium fluoride (LiF, K of about 9.2), barium titanate (BaTiO$_3$, K varies from about 130 to about 1000), lead titanate (PbTiO$_3$, K ranges between about 200 to about 400); and metal oxides (e.g., hafnium dioxide (HfO$_2$, K of about 40), tantalum oxide (TaO$_5$ K of about 27), tungsten oxide (WO$_3$, K of about 42) and zirconium dioxide (ZrO$_2$, K of about 24.7). Other high-K materials can include, for example, La$_2$O$_3$, SrTiO$_3$, LaAlO$_3$, Y$_2$O$_3$, Al$_2$O$_x$N$_y$, HfO$_x$N$_y$, ZrO$_x$N$_y$, La$_2$O$_x$N$_y$, TiO$_x$N$_y$, SrTiO$_x$N$_y$, LaAlO$_x$N$_y$, Y$_2$O$_x$N$_y$, SiON, SiN, a silicate thereof, or an alloy thereof. The dielectric layer also can be formed from or can include, in some embodiments, ferrite beads, e.g. a nonconductive ceramics manufactured from the oxides of nickel, zinc, manganese, or other compounds.

As described herein, regardless of the specific position of one or more capacitors included in the interconnects 116 (or, in some embodiments, the interconnects 216), the capacitor(s) can be assembled under the package substrate 114 and, thus, do not occupy real-estate on the board substrate 130 beyond the surface directly opposite to the surface 115b of the package substrate 114.

Figure 3:
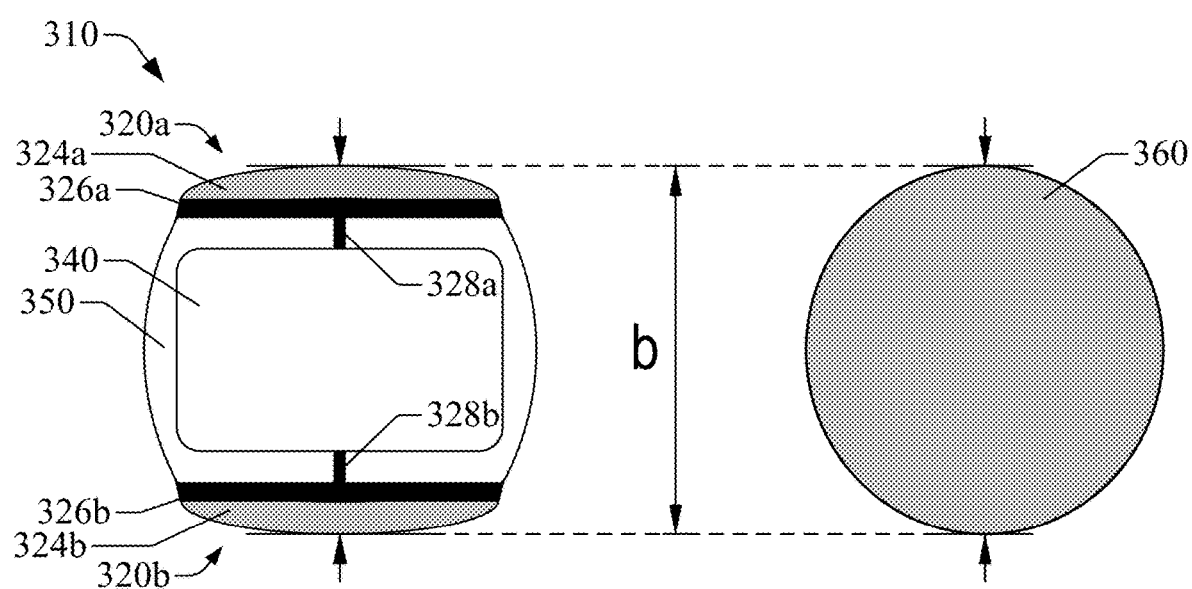
FIG. 3 illustrates cross-sectional views of examples of a solder ball and a solder capacitive interconnect present in semiconductor packages in accordance with one or more embodiments of the disclosure.

As an illustration of a capacitor that can be included in the interconnects 116 or any other interconnects that couple a package substrate to a board substrate in accordance with aspects of this disclosure, FIG. 3 illustrates a schematic cross-sectional view of an example of a solder capacitive interconnect 310 in accordance with one or more embodiments of the disclosure. The exemplified solder capacitive interconnect 310 includes a first electrode 320a and a second electrode 320b. In some scenarios, the first electrode 320a embodies a cathode and the second electrode 320b embodies an anode. In other scenarios, the first electrode 320a embodies an anode, and the second electrode 320b embodies a cathode. Irrespective of assigned polarity within an electric circuit, the first electrode 320a can include a top 324a (e.g., a dome-shaped top) in contact with a terminal plate 326a that is in contact with a metal wire 328a. As illustrated, the metal wire 328a extends from a portion of a surface of the terminal plate 326a to a multilayer capacitor 340. In addition, the second electrode 320b can include a top 324b (e.g., a dome-shaped top) in contact with a terminal plate 326b that is in contact with a metal wire 328b. As illustrated, the metal wire 328b extends from a portion of a surface of the terminal plate 326b to the multilayer capacitor 340. Further or in some embodiments, the solder capacitive interconnect 310 can include a housing for holding the multilayer capacitor and on which the electrode 320a and the electrode 320b can be assembled or otherwise disposed.

For the sake of comparison, FIG. 3 also illustrates a schematic cross-sectional view of a solder ball that can be included in the interconnects 116 or other interconnects present in semiconductor packages in accordance with one or more embodiments of the disclosure. As illustrated, the nominal diameter b (a real number) of the solder ball 360 can be substantially the same as the height of the solder capacitive interconnect 310. As mentioned, b can range from about 400 μm to about 900 μm.

Figure 4:
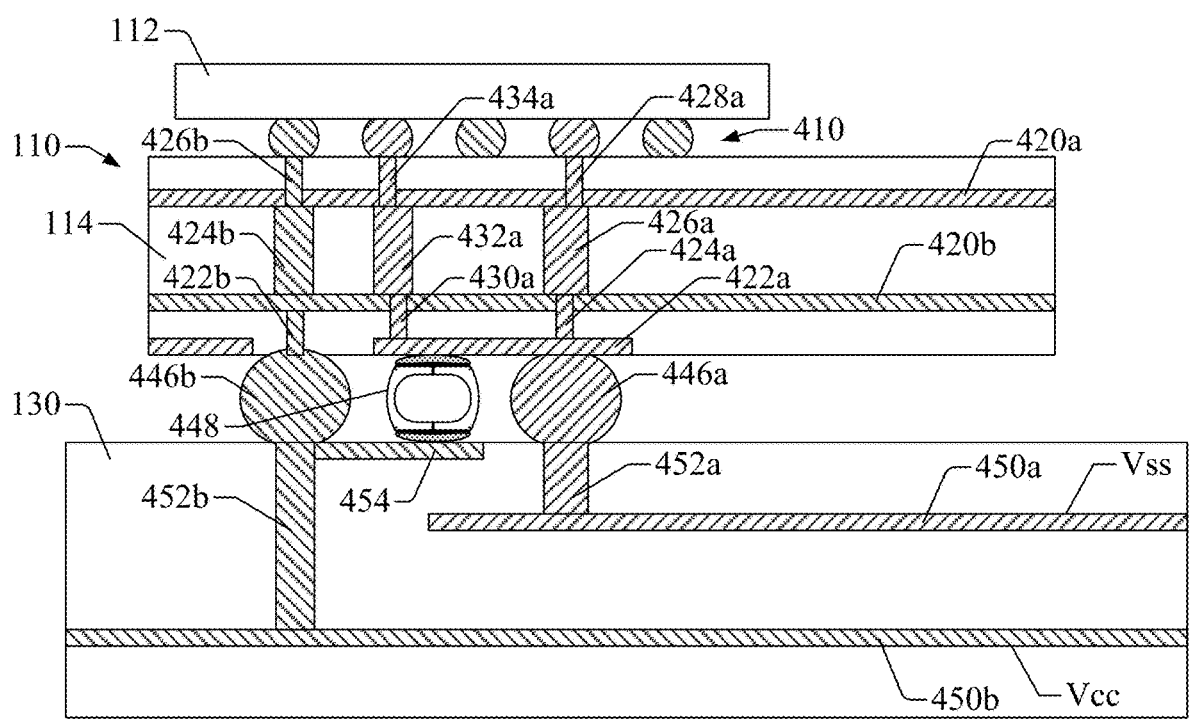
FIG. 4 illustrates an example of a semiconductor package coupled to conductive planes in a board substrate in accordance with one or more embodiments of the disclosure.

As described herein, each of the interconnects 116 in FIG. 1 (or, in some embodiments, the interconnects 216 in FIG. 2) can be mechanically and electrically coupled to a respective portion of the surface 115a and to another respective portion of a surface of the board substrate 130, the surface opposite to the surface 115. In some embodiments, such portions can be embodied in or can constitute an electric conductor, such as a metal pad (also referred to as a pad). As an illustration, FIG. 4 presents a schematic cross-sectional view of an example of coupling between the semiconductor package 110 and the board substrate 130 in accordance with one or more embodiments of the disclosure. As illustrated, the coupling can be permitted or otherwise facilitated by conductors (represented with dashed areas FIG. 4) that can embody or can constitute a power distribution network (PDN) of the example product assembly 100. Die-to-package interconnects 410 can mechanically and electrically couple the die 112 to the package substrate 114. In some embodiments, the die-to-package interconnects 410 can include, for example, a flip-chip BGA (FC-BGA); metal pillars (e.g., copper pillars); solder bumps (e.g., lead-tin solder bumps, low-lead solder bumps, and/or lead-free solder bumps, such as tin-copper bumps); wire bonds; wedge bonds; controlled-collapse chip connects (C4); an anisotropic conductive film (ACF); a nonconductive film (NCF); a combinations thereof, or the like. The package substrate 114 can include a conductive slab 420a and a conductive slab 420, each being disposed or otherwise arranged essentially parallel to a top surface (or a bottom surface) of the package substrate 114. Such conductive planes can be included in a PDN of the assembly package 110 and, thus, in some aspects, can permit or otherwise facilitate the distribution of power. Accordingly, in one aspect, the conductive slab 420a and the conductive slab 420b can be respectively configured (e.g., biased) at a first voltage and a second voltage, the first voltage being greater than the second voltage. As illustrated, a via 426b coupled to a conductive bump 424b can electrically couple one of the conductive bumps 410 to the conductive slab 420b. Similarly, a via 428a can electrically couple another one of the conductive bumps 410 to the conductive slab 420a. In addition, a conductive bump 426a coupled to the via 428a can, in turn, be electrically coupled to a via 424a. The via 424a can be electrically coupled to a pad 422 of the package substrate 114. Further, a via 434a can couple yet another one of the conductive bumps 410 to a conductive bump 432a, which in turn can be electrically coupled to a via 430a. The via 430a also can be electrically coupled to the pad 422a.

As described herein, the package substrate 114 can be mechanically and electrically coupled to the board substrate 130. To that end, a via 422b can be electrically coupled to a conductive interconnect 446b (e.g., a solder ball in a BGA), which in turn can be mechanically and electrically coupled to a pad 454 at a surface of the board substrate 130. In addition, the pad 422a can be mechanically and electrically coupled to a conductive interconnect 446a (e.g., another solder ball in the BGA) that can be mechanically and electrically coupled to a conductive bump 452a of the board substrate 130. Further, a capacitive interconnect 448 in accordance with aspects of this disclosure can be mechanically and electrically coupled to the pad 422a and to the pad 454. To that end, in some aspects, the capacitive interconnect 448 can include a first electrode in contact with the pad 422b, which can form a portion of the surface of the package substrate 114. The capacitive interconnect 448 also can include a second electrode in contact with the pad 454, which can form a portion of a surface of the board substrate 130. In some embodiments, as described herein, the capacitive interconnect 448 can include one or more first metal layers and one or more second metal layers, and dielectric layers intercalating the first metal layer(s) and the second metal layer(s). The first electrode of the capacitive interconnect 448 can include a metal plate and an amount of solder material in contact with a top surface of the metal plate, wherein the metal plate has a bottom surface in contact with the first metal layer(s). In addition, the second electrode of the capacitive interconnect 448 can include a second metal plate and a second amount of solder material in contact with a second top surface of the second metal plate, wherein the second metal plate has a bottom surface in contact with the second metal layers. The conductive interconnects 446b and 446a and the capacitive interconnect 448 can be included, in some scenarios, in the interconnects 116 in FIG. 1.

As illustrated, the board substrate 130 can include a conductive slab 450a and a conductive slab 450b, each being disposed or otherwise arranged essentially parallel to a top surface (or a bottom surface) of the package substrate 114. Such conductive slabs (which also may be referred to as conductive planes) can be included in a PDN of the semiconductor package 110 and, thus, in some aspects, can permit or otherwise facilitate the distribution of power. Accordingly, in one aspect, the conductive slab 450a and the conductive slab 450b can be respectively configured at a first voltage and a second voltage, the first voltage being greater than the second voltage. As illustrated in FIG. 4, the metal pad 422b can be in electrical contact, via the conductive interconnect 446 and the conductive bump 452a, with the conductive slab 450a within the board substrate 130. In addition, the metal pad 454 can be in electrical contact, via a conductive bump 452b, with the metal slab 450b within the board substrate 130. As further illustrated in FIG. 4, in some embodiments, the first voltage may be customarily referred to as Vss and the second voltage may be customarily referred to as Vcc. Further, in FIG. 4, each conductive element to which the first voltage can be applied is marked with right-slanted hatching, and each conductive element to which the second voltage can be applied is marked with left-slanted hatching.

Figure 5A:
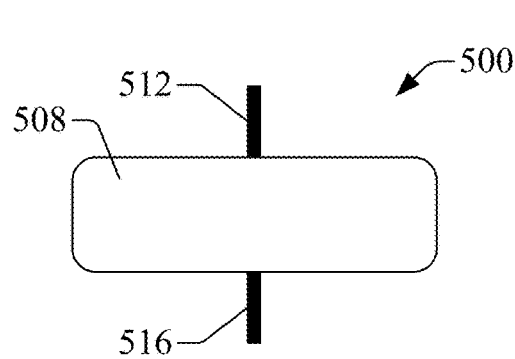
FIGS. 5A-5E illustrate schematic cross-sectional views of structures representative of respective stages of an example process for forming a capacitive interconnect in accordance with one or more embodiments of the disclosure. Specifically.

FIGS. 5A-5E illustrate schematic cross-sectional views representative of stages of an example process for forming a solder capacitive interconnect in accordance with one or more embodiments of the disclosure. More specifically, FIG. 5A illustrates a schematic cross-sectional view of an example of a capacitor 500 in accordance with one or more embodiments of the disclosure. The capacitor 500 can be embodied in a multilayer ceramic capacitor (MLCC) and serves as a precursor for forming the capacitive interconnect. The capacitor 500 can be formed according to various processes, including, for example, the winding of an anode foil and a cathode foil into a capacitor disk roll 508. The capacitor 500 has an anode electrode 512 and a cathode electrode 516.

Figure 5B:
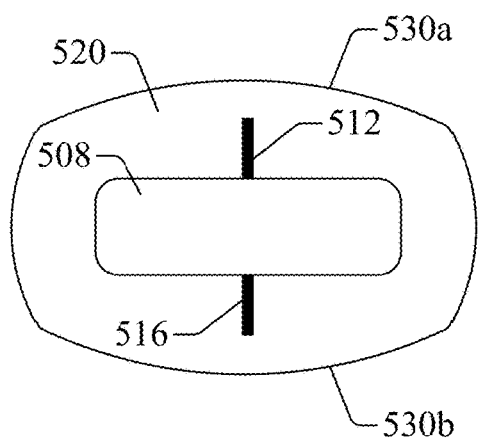

The capacitor 500 can be treated to form a solid structure 520 that encases the capacitor 500, as shown in FIG. 5B. The solid structure 520 can include a first end surface 530a and a second end surface 530b. In one embodiment, treating the capacitor 500 can include mold forming or encapsulating. In another embodiment, treating the capacitor 500 can include coating the capacitor 500 with an epoxy resin (such as EX-74) or a bismaleimide-triazine (BT) resin, for example.

Figure 5C:
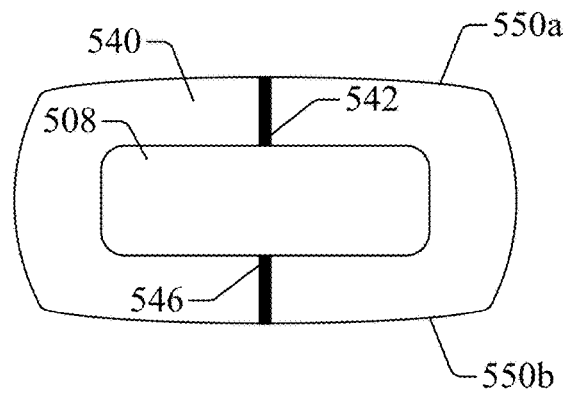

The solid structure 520 can be treated to planarize the end surfaces 530a and 530b. Such treatment also can remove at least a portion of the electrodes 512 and 516, resulting in an anode electrode 542 and a cathode electrode 546, as shown in FIG. 5C. As such, in some aspects, treating the solid structure 520 can result in another solid structure 540, as shown in FIG. 5C, that encases the capacitor disk roll 508, the solid structure 540 having a substantially flat first end surface 550a and a substantially flat second end surface 550b.

Figure 5D:
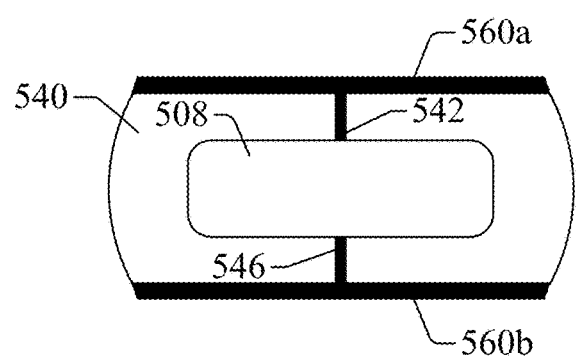

As shown in FIG. 5D, the solid structure 540 also can be treated to form a first conductive terminal 560a mechanically coupled and electrically coupled to the anode electrode 542, and also to form a second conductive terminal 560b mechanically coupled and electrically coupled to the cathode electrode 546. To that end, in some embodiments, the end surface 550a can be plated, via electroless plating and/or electrolytic plating, for example, to deposit an amount of a metal (e.g., Cu, Al, W, Ni, Ag, Au, Pt, Pd, an alloy of two or more of the foregoing, or the like) to form the conductive terminal 560a. The end surface 550b also can be plated, via electroless plating and/or electrolytic plating, for example, to deposit another amount of the metal to form the conductive terminal 560b.

Figure 5E:
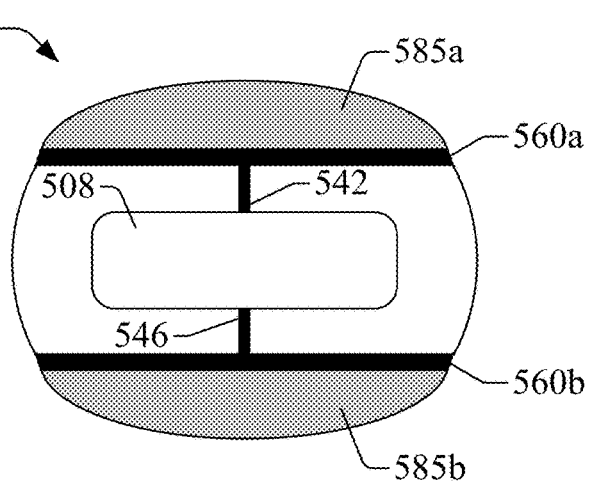

While the structure shown in FIG. 5D can be utilized as a capacitive interconnect, such a structure can be treated to form respective solder top 585a and solder top 585b onto the conductive terminal 560a and 560b. In some implementations, each of such tops can be shaped as a dome. More specifically, in some embodiments, treating each of the conductive terminals 560a and 560b can include solder dipping such terminals. In other embodiments, treating the terminals 560a and 560b can include printing some amounts of solder paste (e.g., SnPb-alloy paste) on respective non-abutted surfaces of such terminals and heating (via reflow treatment) the printed amounts of solder paste. FIG. 5E illustrates the resulting solder capacitive interconnect 580. The solder tops 585a and 585b can permit or otherwise facilitate integrating the solder capacitive interconnect 580 into a solder BGA, for example, as described herein in connection with the interconnects 116 and the interconnects 216.

Figure 6A:
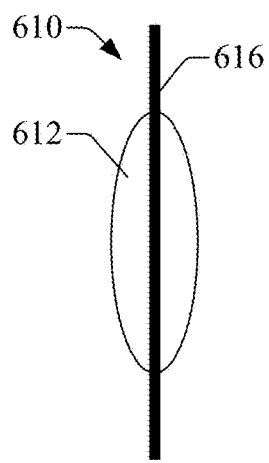
FIGS. 6A-6I illustrate schematic cross-sectional views representative of stages of an example process for forming a multilayer capacitor in accordance with one or more embodiments of the disclosure. Specifically.

FIGS. 6A-6I illustrate schematic cross-sectional views representative of stages of an example process for forming a multilayer capacitor in accordance with one or more embodiments of the disclosure. More specifically, as shown in FIG. 6A, a precursor element 610 is provided in an initial stage of the example process. The precursor element 610 can include a ceramic core 612 having a first end and an opposing second end. In some aspects, the ceramic core 612 can be oblong and nearly cylindrically symmetric about a longitudinal axis (e.g., the elongation axis) of the ceramic core 612. In another aspect, a metal wire 616 pierces the ceramic core 612 essentially along the longitudinal axis, extending directly from the first end to the second end. The metal wire also extends outward from the first end along the longitudinal axis, and further extends outward from the second end in an opposing direction along the longitudinal axis. The metal wire 616 can be formed from or can include Ni, W, Cu, or another metal.

Figure 6B:
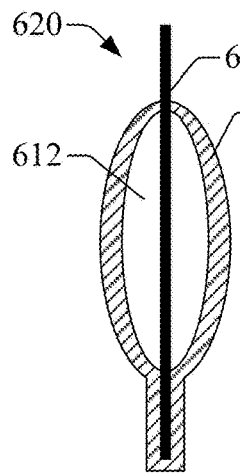

The precursor element 610 can be treated to form a solid structure 620 having a metal layer 622 that coats the ceramic core 612 and a portion of the metal wire 616, as illustrated in FIG. 6B. To that end, the precursor element 610 can be covered with an amount of a metal—e.g., a base/simple metal, a noble metal, an alloy of two or more metals, or the like. In some aspects, coverage of the precursor element 610 with the amount of the first metal can be accomplished by one or a combination of numerous metal deposition processes, including, for example, chemical vapor deposition (CVD); atomic layer deposition (ALD); physical vapor deposition (PVD); sputtering; chemical solution deposition; plating (e.g., electroless plating or electrolytic plating, immersion plating, or a combination thereof); or the like. Chemical vapor deposition can include, for example, metal organic chemical vapor deposition (MOCVD), low-pressure chemical vapor deposition (LPCVD), or plasma enhanced chemical vapor deposition (PECVD).

Therefore, in some embodiments, covering the ceramic core 612 and the portion of the metal wire 616 can include depositing the amount of the first metal (e.g., Cu) by plating the ceramic core 612 and the portion of the metal wire 616. In an implementation in which the plating is performed via electroless plating (or autocatalytic plating), a second portion of the metal wire 616 that is not plated can be utilized to control the immersion of the ceramic core 612 and the portion of the metal wire 616 that is plated into an electroless bath contained in a vat, the bath including an aqueous solution of metal ions (e.g., Cu ions), reducing agents and other agents, and bath stabilizers.

Figure 6C:
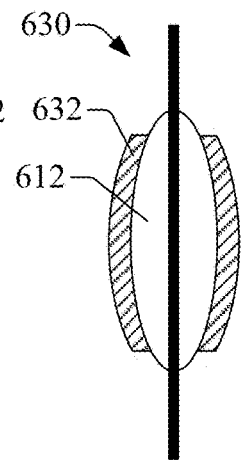

As part of the example process, the metal layer 622 of the solid structure 620 can be treated to remove respective amounts of the first metal from the metal layer 622 near the first end and the second end of the ceramic core 612. As illustrated in FIG. 6C, removing such amounts can result in a core-shell structure 630 having a metal layer 632 coating or otherwise covering the ceramic core 612. In some implementations, in order to remove the first metal, treating the solid structure 620 can include selectively etching the first metal during a defined period. As such, in one example, the first end and the second end can be immersed, in sequence, during respective defined periods, into a vat containing an etching solution that can selectively remove the first metal (e.g., Cu, W, Ag, Au, Pt, or the like). The etching solution can include, for example, ferric chloride or another metallurgic etching solution.

Figure 6D:
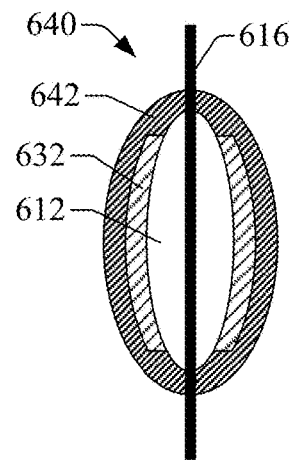

The solid structure 630 can be covered or otherwise coated with an amount of a dielectric material, resulting in the solid structure 640 shown in FIG. 6D. The solid structure 640 can have a dielectric layer 642 nearly concentrically abutting at least a portion of the metal layer 632. As described herein, numerous dielectric materials can be utilized, including ceramics, high-k dielectric materials, or a combination thereof. Further, numerous deposition processes can be utilized to deposit the amount of the dielectric material, including any one or a combination of CVD, ALD, PVD, sputtering, chemical solution deposition, or the like. The dielectric layer 642 can be cured or otherwise treated in order to harden the dielectric material and, thus, render the solid structure 640 mechanically stable. Curing the amount of the dielectric layer 642 can include annealing the solid structure 640 for a defined period at a defined temperature ranging from about 800° C. to about 1100° C. The defined period and/or defined temperature can be specific to the dielectric material utilized to form the dielectric layer 642.

Figure 6E:
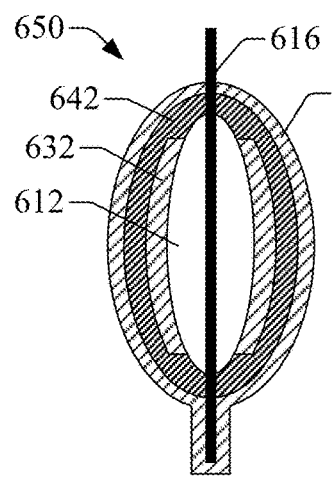
Figure 6F:
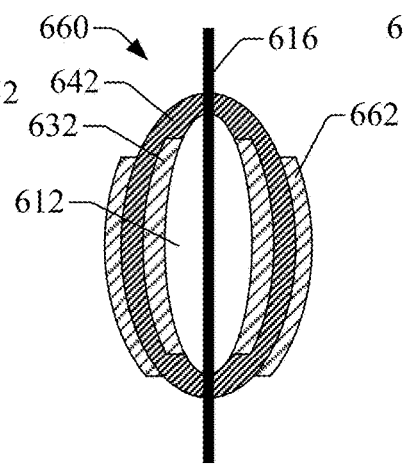

The example process can continue with additional treatment of the solid structure 640, the treatment resulting in the solid structure 650 shown in FIG. 6E. Thus, in some aspects, the solid structure 640 can be covered with an amount of a metal—e.g., a base metal, a noble metal, an alloy of two or more metals, or the like. The metal can be the same as the metal utilized to form the metal layer 622, for example. Yet, the disclosure is not so limited and another metal can be utilized. As described herein, coverage of the solid structure 640 with the amount of the metal can be accomplished by any one or a combination of numerous metal deposition processes, including, for example, CVD, ALD, PVD, sputtering, chemical solution deposition, plating (autocatalytic plating, immersion plating, electrolytic plating, or a combination thereof), or the like. As illustrated, the solid structure 650 includes a metal layer 652 that coats or otherwise covers the dielectric layer 642 and a portion of the metal wire 616.

Similar to the treatment of the solid structure 620, the solid structure 650 also can be treated to remove respective amounts of the metal layer 652 from regions proximate to the opposing ends of the solid structure 620. Therefore, in some aspects, the treatment of the solid structure 650 can result in the solid structure 660 shown in FIG. 6F. As illustrated, the solid structure 660 can include a metal layer 662 nearly concentrically abutting at least a portion of the dielectric layer 642. In one aspect, the dielectric layer 642 in the solid structure 660 is intercalated between the metal layer 632 and the metal layer 662. Accordingly, the solid structure 660 can embody or can include a capacitor having two conductors respectively embodied in the metal layers 632 and 662, the conductors in contact with and separated by the dielectric layer 642.

Figure 6G:
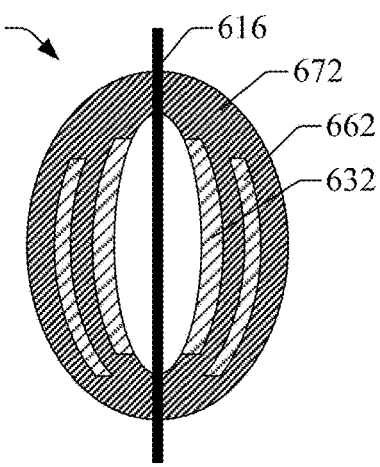

Additional metal and dielectric layers can be added to the capacitor in the solid structure 660 by treating such structure in a similar fashion as described herein. More specifically, as shown in FIG. 6G, an amount of dielectric material (e.g., a high-K material) can be deposited on the solid structure 660 and can be subsequently cured in order to form the solid structure 660 having the dielectric structure 670. In some aspects, a portion of the dielectric structure 670 nearly concentrically abuts the metal layer 662. As described herein, deposition of the amount of the dielectric material can be accomplished by numerous deposition processes, including, for example, CVD, ALD, PVD, sputtering; chemical solution deposition; or the like. In some implementations, depositing the second amount of the dielectric material can include sputtering the dielectric material during a defined period.

Figure 6H:
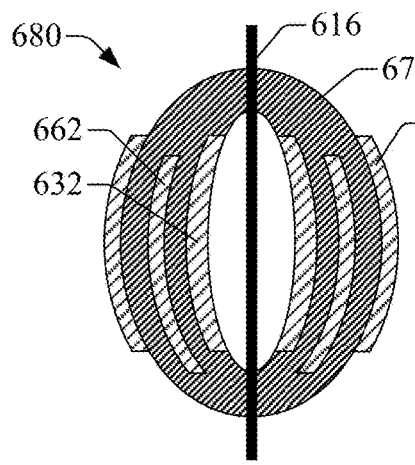
Figure 6I:
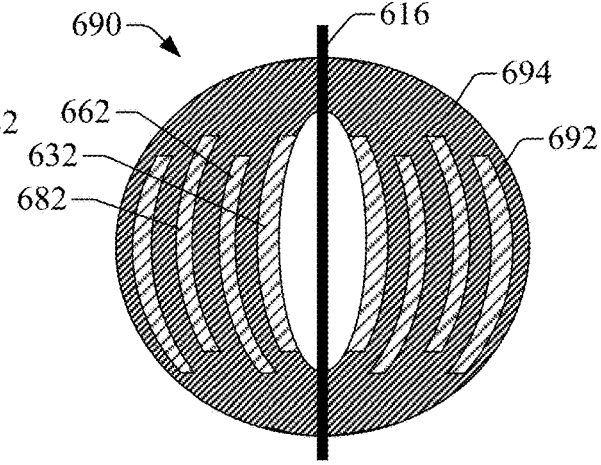

The dielectric structure 670 also can be treated to form another layer of metal that nearly concentrically abuts the dielectric structure 670, resulting in the solid structure 680 shown in FIG. 6H. As such, the solid structure 680 includes an additional dielectric-metal bilayer and, therefore, embodies another multilayer capacitor having a greater size (and, in one aspect, capacitance) than the capacitor embodied by the solid structure 660.

The solid structure 680 also can be treated to form additional metal and dielectric layers. More specifically, subsequent treatments including deposition of respective amounts of metal and dielectric material can yield the solid structure 690 shown in FIG. 6I. The solid structure 690 includes a dielectric structure 694 enclosing and in contact with a metal layer 692, which can be nearly concentric with the metal layers 632, 662, and 682. Therefore, in some aspects, the solid structure 690 includes an additional dielectric-metal bilayer and, therefore, embodies another multilayer capacitor having a greater size (and, in one aspect, capacitance) than the capacitor embodied by the solid structure 680.

Further treatments can be performed to the solid structure 690 and resulting solid structures until a satisfactory or otherwise desired multilayer ball capacitor has been formed. A satisfactory capacitor can be a capacitor having a defined number of metal layers or a defined number of intercalating dielectric layers. A satisfactory capacitor also can be a capacitor having a defined capacitance. More generally, treatments can proceed until one or more completion criteria are satisfied.

Variations of the process described with reference to FIGS. 6A-6I and/or other processes can be implemented to fabricate multilayer capacitors in accordance with aspects of this disclosure. Specifically, as an illustration, FIGS. 7A-7I present schematic cross-sectional views representative of stages of an example process for forming a multilayer capacitor in accordance with one or more embodiments of the disclosure. As discussed in connection with FIG. 6A and as is shown in FIG. 7A, a precursor element 710 can be provided in an initial stage of the example process. The precursor element 710 can include a ceramic core 712 having a first end and an opposing second end. In some aspects, the ceramic core 712 can be oblong and nearly cylindrically symmetric about a longitudinal axis (e.g., the elongation axis) of the ceramic core 712. In another aspect, a metal wire 716 pierces the ceramic core 712 essentially along the longitudinal axis, extending directly from the first end to the second end. The metal wire 716 also extends outward from the first end along the longitudinal axis, and further extends outward from the second end in an opposing direction along the longitudinal axis. The metal wire 716 can be formed from or can include Ni, W, Cu, an alloy of two or more of the foregoing, or another metal.

As part of the example process, the precursor element 710 can be treated to form a solid structure 720 having a metal layer 722 that coats or otherwise covers a portion the ceramic core 712 and a portion of the metal wire 716, as illustrated in FIG. 7B. To that end, the precursor element 710 can be covered with an amount of a metal—e.g., a simple metal, a noble metal, an alloy of two or more metals, or the like. In some aspects, coverage of the precursor element 710 with the amount of the metal can be accomplished by one or a combination of numerous metal deposition processes, including, for example, CVD; ALD; PVD; sputtering; chemical solution deposition; metal plating; a combination of the foregoing; or the like. In addition, in some embodiments, to achieve the partial coverage of the precursor element 710, a mask can be placed in a region proximate to an end of the ceramic core 712. In other embodiments, the precursor element 710 can be placed or otherwise assembled in a position suitable for the amount of the metal to cover a portion of the ceramic core 712. For instance, the precursor element 710 may be partially immersed in a plating bath within a vat during deposition of the amount of the metal.

Therefore, in some embodiments, covering a portion of the ceramic core 712 and another portion of the metal wire 716 can include depositing the amount of the metal (e.g., Cu) by plating the ceramic core 712 and the portion of the metal wire 716. In an implementation in which the plating is performed via electroless plating (or autocatalytic plating), a second portion of the metal wire 716 that is not plated can be utilized to control the immersion of the ceramic core 712 and the portion of the metal wire 716 that is plated into an electroless bath contained in a vat, the bath including an aqueous solution of metal ions (e.g., Cu ions), reducing agents and other agents, and bath stabilizers.

As part of the example process, the metal layer 722 of the solid structure 720 can be treated to add a layer of dielectric material. To that end, in one aspect, the solid structure 720 can be covered or otherwise coated with an amount of a dielectric material, resulting in the solid structure 730 shown in FIG. 7C. The solid structure 730 can have a dielectric layer 732 nearly concentrically abutting at least a portion of the metal layer 722. As mentioned, numerous dielectric materials can be utilized, including ceramics, high-k dielectric materials, or a combination thereof. Further, numerous deposition processes can be utilized to deposit the amount of the dielectric material, including any one or a combination of CVD, ALD, PVD, sputtering, chemical solution deposition, or the like. The dielectric layer 732 can be cured or otherwise treated in order to harden the dielectric material and, thus, render the solid structure 730 mechanically stable or to improve the mechanical stability thereof. Curing the amount of the dielectric layer 732 can include annealing the solid structure 730 for a defined period at a defined temperature ranging from about 800° C. to about 1100° C. The defined period and/or defined temperature can be specific to the dielectric material utilized to form the dielectric layer 732.

The example process in connection with FIGS. 7A-7I can continue with additional treatment of the solid structure 730, the treatment can result in the solid structure 740 shown in FIG. 7D. Thus, in some aspects, the solid structure 740 can be covered with an amount of a metal—e.g., a base metal, a noble metal, an alloy of two or more metals, or the like. The metal can be the same as the metal utilized to form the metal layer 722, for example. Yet, the disclosure is not so limited and another metal can be utilized. As described herein, coverage of the solid structure 740 with the amount of the metal can be accomplished by any one or a combination of numerous metal deposition processes, including, for example, CVD, ALD, PVD, sputtering, chemical solution deposition, plating (autocatalytic plating, immersion plating, electrolytic plating, or a combination thereof), or the like.

As illustrated in FIG. 7D, the solid structure 740 includes a metal layer 742 that coats or otherwise covers a portion of the dielectric layer 732 and another portion of the metal wire 716. The metal layer 742 nearly concentrically abuts at least a portion of the dielectric layer 732. In one aspect, the dielectric layer 732 in the solid structure 740 is intercalated between the metal layer 722 and the metal layer 742. Accordingly, the solid structure 740 can embody or can include a capacitor having two conductors respectively embodied in the metal layers 722 and 742, the conductors in contact with and separated by the dielectric layer 732.

Additional metal and dielectric layers can be added to the capacitor in the solid structure 740 by treating such structure in a similar fashion as described herein. More specifically, as shown in FIG. 7E, an amount of dielectric material (e.g., a high-K material) can be deposited on the solid structure 740 and can be subsequently cured in order to form the solid structure 750 having the resulting dielectric structure 752. In some aspects, a portion of the dielectric structure 752 nearly concentrically abuts the metal layer 742. As described herein, deposition of the amount of the dielectric material can be accomplished by numerous deposition processes, including, for example, CVD, ALD, PVD, sputtering; chemical solution deposition; or the like. In some implementations, depositing the amount of the dielectric material can include sputtering the dielectric material during a defined period.

The dielectric structure 750 also can be treated to form another layer of metal that nearly concentrically abuts the dielectric structure 752, resulting in the solid structure 760 shown in FIG. 7F. As such, in one aspect, the solid structure 760 includes an additional dielectric-metal bilayer and, therefore, embodies another multilayer capacitor having a greater size (and, in one aspect, capacitance) than the capacitor embodied by the solid structure 740. Such an additional dielectric-metal bilayer includes a portion of the dielectric structure 752 and the metal layer 762.

The solid structure 760 also can be treated to form additional metal and dielectric layers. More specifically, subsequent treatments including deposition of respective amounts of metal and dielectric material can yield the solid structure 770 and solid structure 780 respectively shown in FIGS. 7G and 7H. The solid structure 770 includes a dielectric structure 772, which can be formed by deposition of an amount of a dielectric material and subsequent curing of the deposited dielectric material. As mentioned, the amount of the dielectric material can be deposited via numerous deposition processes, including, for example, CVD, ALD, PVD, sputtering; chemical solution deposition; or the like. In some implementations, depositing the amount of the dielectric material can include sputtering the dielectric material during a defined period. The deposited material also can be cured as described herein in order to render the dielectric structure 772 mechanically stable or improve the mechanical stability thereof.

The dielectric structure 772 encloses and is in contact with the metal layer 762, which can be nearly concentric with the metal layers 742, and 722. Therefore, in some aspects, the solid structure 770 includes at least one additional dielectric-metal bilayer and, therefore, embodies another multilayer capacitor having a greater size (and, in one aspect, capacitance) than the capacitor embodied by the solid structure 760.

The solid structure 760 can be treated to form a metal layer 782. As described herein, the metal layer 782 can be formed by depositing an amount of metal on the solid structure 770. The amount of metal can be deposited by implementing any one or a combination of numerous metal deposition processes, including, for example, CVD, ALD, PVD, sputtering, chemical solution deposition, plating (autocatalytic plating, immersion plating, electrolytic plating, or a combination thereof), or the like. In addition, the solid structure 760 can be treated to form another layer of dielectric material, resulting in the solid structure 790 shown in FIG. 7I. More specifically, formation of such a layer can result in a dielectric structure 792. Similarly to other dielectric structures, the dielectric structure 792 can enclose and can be in contact with metal layers. Therefore, in some aspects, the solid structure 790 can embodies another multilayer capacitor having a greater size (and, in one aspect, capacitance) than the capacitor embodied by the solid structure 770, for example. The layer of dielectric material that can be added to the solid structure 780 can be formed by depositing an amount of the dielectric material by implementing any one or a combination of numerous deposition processes, including, for example, CVD, ALD, PVD, sputtering; chemical solution deposition; or the like. In some implementations, depositing the amount of the dielectric material can include sputtering the dielectric material during a defined period. The deposited material also can be cured as described herein in order to render the dielectric structure 792 mechanically stable or improve the mechanical stability thereof.

Further treatments can be performed to the solid structure 790 and resulting solid structures until a satisfactory or otherwise desired multilayer ball capacitor has been formed. A satisfactory capacitor can be a capacitor having a defined number of metal layers or a defined number of intercalating dielectric layers. A satisfactory capacitor also can be a capacitor having a defined capacitance. More generally, treatments can proceed until one or more completion criteria are satisfied.

FIGS. 8A-8E illustrate schematic cross-sectional views of structures representative of respective stages of an example process for forming a solder capacitive interconnect in accordance with one or more embodiments of the disclosure.

To form the solder capacitive interconnect, in some aspects, a multilayer ball capacitor having metal layers intercalated with dielectric layers can be treated to remove a portion in the vicinity of a first end and a second portion in another vicinity of an opposing second end. Specifically, in some aspects, the treatment can include the respective planarization of the vicinity of the first end and the other vicinity of the second end. In some implementation, such planarization can be accomplished by etching respective amounts of a dielectric material in the respective vicinities of the first end and the opposing second end. In addition or in other implementations, the planarization can be accomplished by polishing off (mechanically, chemically, or otherwise) respective amounts of the dielectric material. Removing the respective amounts of the dielectric material can result in the example multilayer capacitor 810 shown in FIG. 8A. As illustrated, the multilayer capacitor 810 can include a core 806 (such as a ceramic core) and metal rod 804 disposed on a longitudinal axis of the multilayer capacitor 810. The multilayer capacitor 810 also can include metal layers 808a, 808b, 808c, 808d, 808e, 808f, 808g, and 808h intercalated by a dielectric material 814. As such, in one aspect, the metal layers 808a-808h and the intercalating dielectric material 814 can form a dielectric-metal multilayer having essentially concentrically arranged layers of metal and dielectric material.

Figure 8A:
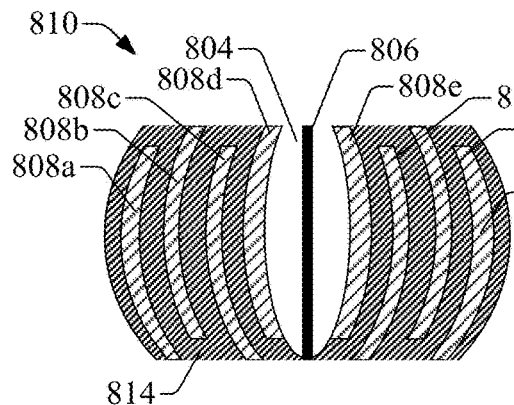
FIGS. 8A-8E illustrate schematic cross-sectional views of structures representative of respective stages of an example process for forming a capacitive interconnect in accordance with one or more embodiments of the disclosure. Specifically.
Figure 8B:
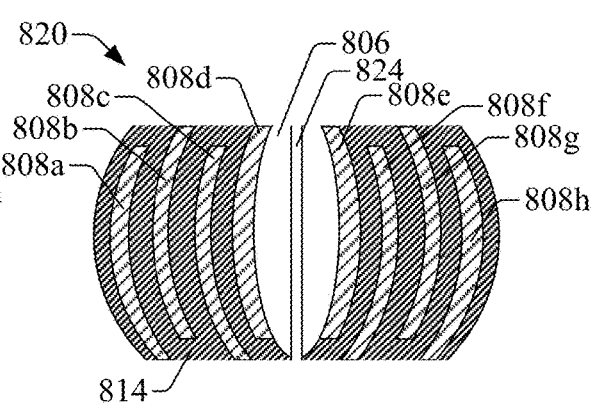
Figure 8C:
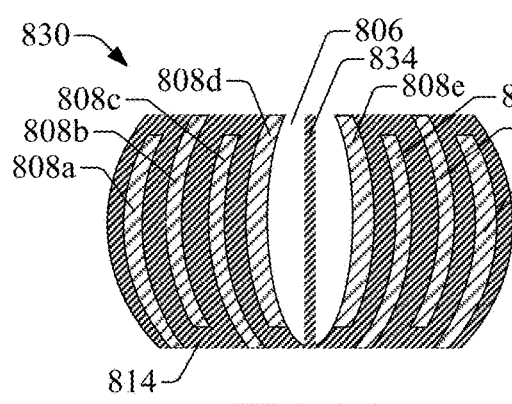

The multilayer capacitor 810 can be treated to remove the metal rod 804, resulting in another multilayer capacitor 820, as shown in FIG. 8B. Treating the solid structure 810 can include selectively etching the metal that forms the metal rod 804. In view of the removal of the metal rod 804, the multilayer capacitor 820 defines an opening 824. The dielectric-metal multilayer structure of the multilayer capacitor 810 is preserved in the multilayer capacitor 820.

In a subsequent treatment stage, the opening 824 can be filled with a dielectric material in order to increase the amount of dielectric present in the multilayer capacitor 820. To that end, the multilayer capacitor 820 can be treated to deposit an amount of dielectric material to fill the opening 824, resulting in a dielectric rod 834 within the ceramic core 806. In one implementation, depositing the amount of the dielectric material can include sputtering the dielectric material. In another implementation, the dielectric material can be deposited via CVD or other processes to cover the opening 834 with the amount of the dielectric material. Treating the multilayer capacitor 810 in such a fashion can result in the multilayer capacitor 830 shown in FIG. 8C. The dielectric-metal multilayer structure of the multilayer capacitor 810 is preserved in the multilayer capacitor 820.

Figure 8D:
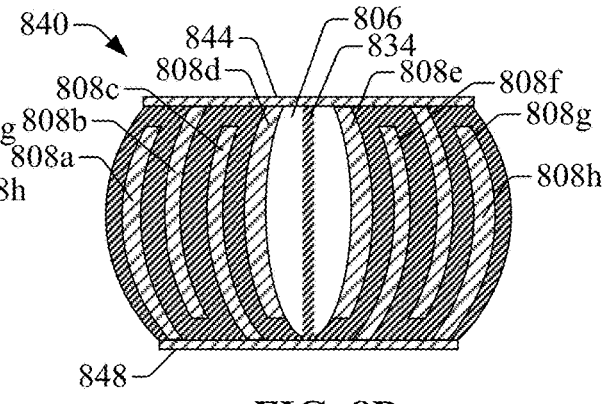
Figure 8E:
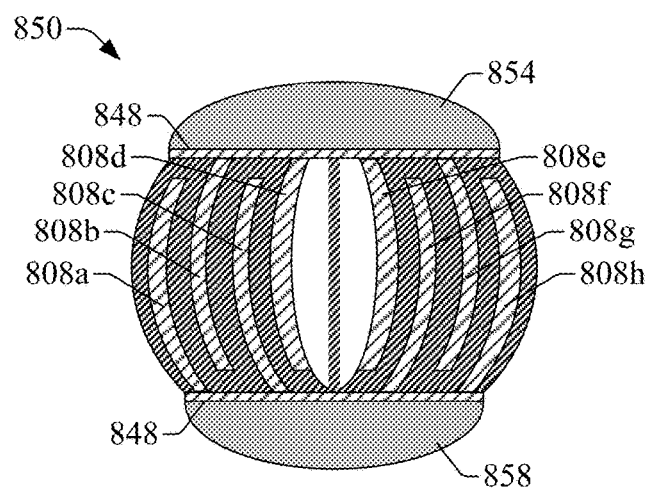

The multilayer capacitor 820 can be treated in order to form electrodes that can permit electrically and mechanically coupling the multilayer capacitor 820 to electrical conductors (e.g., metal pads, conductive planes, vias, or the like) in a product assembly. To that end, as illustrated in FIG. 8D, in some implementations, a first conductive slab 844 can be formed at a first end of the multilayer capacitor 820, and a second conductive slab 848 can be formed at an opposing second end of the multilayer capacitor 820. Each of the first conductive slab 844 and the second conductive slab 848 can be formed from or can include respective amounts of a metal selected, for example, from Cu, Al, W, Au, Ag, Pt, Pd, or other noble metals; nickel; or an alloy of two or more of the foregoing elements. As such, in some implementations, the first conductive slab 844 and the second conductive slab 848 can be formed by electroless plating of the first end of multilayer capacitor 830 with an amount of the metal. In other implementations, electrolytic plating can be utilized instead of electroless plating in order to deposit the respective amounts of the metal forming the first conductive slab 844 and the second conductive slab 848. In some embodiments, an adhesion layer (e.g., a layer of refractory metal, a layer of a refractory metal alloy, or the like) and/or a seed layer (e.g., Cu seed layer) can be deposited (via PVD and/or CVD process, for example) prior to the electroless and/or electroplating of the first conductive slab 844 and/or the second conductive slab 848.

Formation of the first conductive slab 844 and the second conductive slab 848 can result in the formation of a capacitive interconnect embodied by the multilayer capacitor 840 shown in FIG. 8D. In order to utilize such capacitive interconnect in a semiconductor package in accordance with this disclosure, the multilayer capacitor 840 can be treated to form solder capacitive interconnect 850 shown in FIG. 8E. More specifically, the treatment of the multilayer capacitor 840 can permit forming solder-based electrodes. To that end, in some aspects, a first amount of solder material can be applied at a surface of the first conductive slab 844, resulting in a first solder top 854. Similarly, a second amount of solder material can be applied at a surface of the second conductive slab 848, resulting in a second solder top 858. In some implementations, applying the first amount of solder material can include solder dipping the first conductive slab 844 and heating, via a reflow process, for example, the solder material adhered or otherwise attached to the to the first conductive slab 844 as a result of the dipping. In other implementations, applying the first amount of solder material can include printing a solder paste of the solder material on the first conductive slab 844, and heating, via a reflow process, for example, the printed solder paste. The second amount of solder material can be applied similarly, utilizing either solder dipping or solder printing combined with a heating process.

The example process represented by FIGS. 8A-8E for forming the solder capacitive interconnect 850 can end after the formation of the first solder top 854 and the second solder top 858. The solder capacitive interconnect 850 can be assembled within a group of interconnects, e.g., interconnects 116, within a semiconductor package in accordance with aspects described herein.

In some aspects, the formation, via sputtering, of the dielectric layers in a multilayer capacitor included in a solder capacitive interconnect can result in dielectric layers having a thickness of less than a micron (or 0.04 mil), which can permit achieving a high capacitance per area. For instance, a multilayer capacitor formed by successive metallization and deposition of dielectric layers as described herein can provide a capacitance/area that is about 1.6 times greater than the capacitance/area of a typical MLCC. Without intending to be bound by modeling and/or theory, such an estimate can be determined by assuming that a model solder capacitive interconnect having a nominal diameter of about 16 mil can be modeled as cube having a side of about 15 mil. In addition, adopting dielectric layers having a thickness of about 1 µm, the capacitance per pair of metal layers can be estimated to be about 1.52 nF. As such, when the estimated capacitance/area of the model solder capacitive interconnect is compared to the 1.19 µF/µm$^2$ of an MLCC having a capacitance of about 1 µF and an area of about 740 µm×1140 µm, it is determined that the model solder capacitive interconnect can have a capacitance/are that is a factor of about 1.6 greater than the capacitance/area of the typical MLCC.

In view of the aspects described herein, numerous other processes can implemented for providing a solder capacitive interconnect in accordance with this disclosure. Examples of such processes can be better appreciated with reference to the flowcharts in FIGS. 9 and 10. Each block in the illustrated flowcharts can represent a process stage or process operation (e.g., etching or removal of an amount of a material, coating of a structure with another amount of another material, and the like). Although a particular order of the blocks within an illustrated flowchart is provided, such ordering is not limiting and the order two or more of the blocks can be altered without affecting the outcome of the process. For the sake of clarity, well-known elements or aspects of a block in the illustrated flowcharts may not be described in full detail. As with any other processes described herein, the example methods 800 and 900 illustrated by FIGS. 8-9 can be implemented in conjunction with each other.

Figure 9:
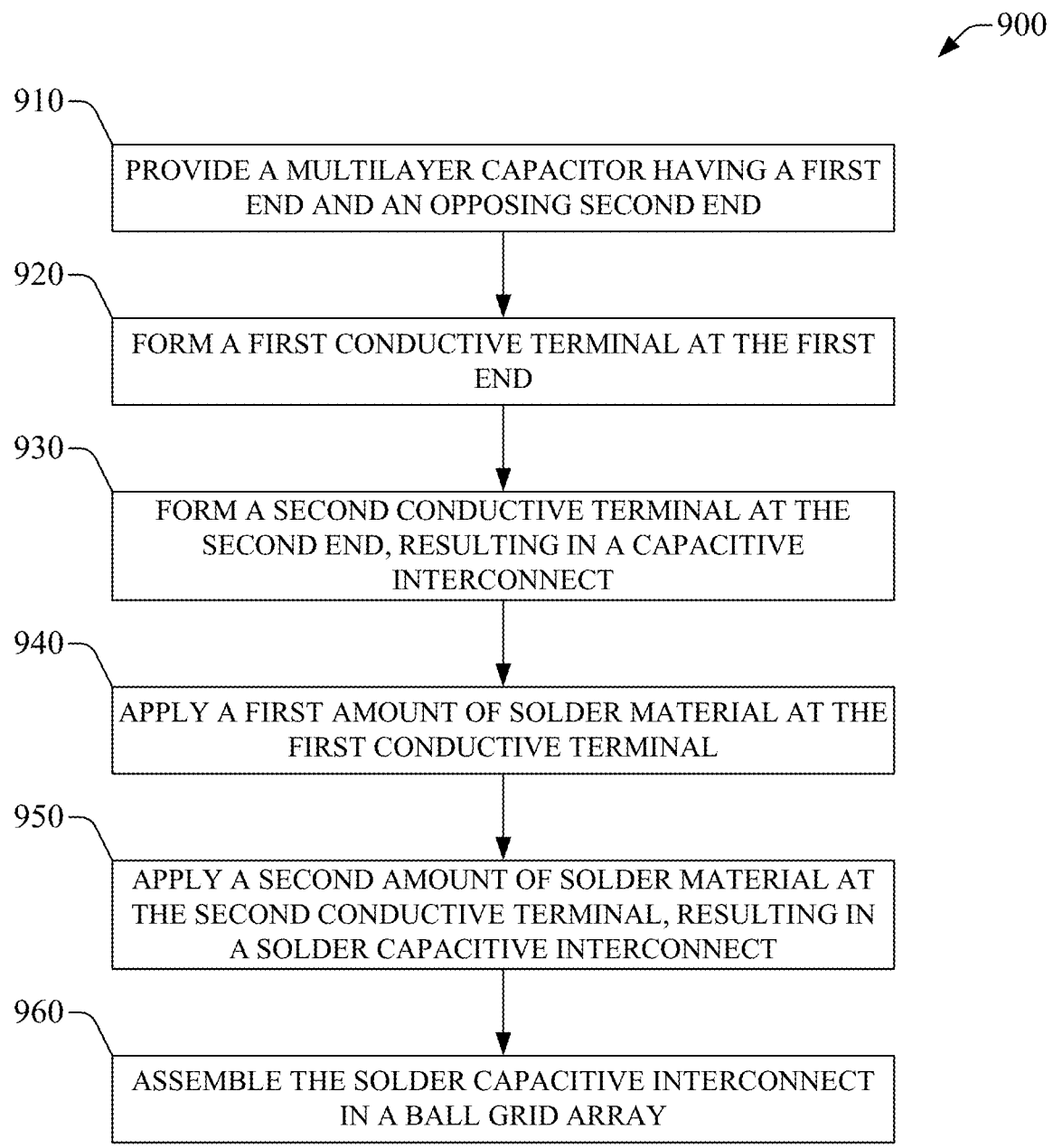
FIG. 9 illustrates an example of a method for providing a solder capacitive interconnect in accordance with one or more embodiments of the disclosure.

FIG. 9 illustrates an example of a method for providing a solder capacitive interconnect in accordance with one or more embodiments of the disclosure. At block 910, a multilayer capacitor having a first end and an opposing end can be provided. In some implementations, providing the multilayer capacitor can include providing a multilayer ceramic capacitor (MLCC). In other implementations, providing the multilayer capacitor can include implementing the example method 900 illustrated in FIG. 9. At block 920, a first conductive terminal can be formed at the first end of the multilayer ball capacitor. The first conductive terminal can include a metal or a metallic alloy, where the metal can be selected, for example, from Cu, W, Au, Ag, Pd, or other noble metals, or the like. As such, in some implementations, the first conductive terminal can be formed by electroless plating of the first end with the metal. In other implementations, electrolytic plating can be utilized instead of electroless plating.

At block 930, a second conductive terminal can be formed at the second end of the multilayer ball capacitor. The second conductive terminal can include, for example, the same metal or the same metallic alloy included in the first conductive terminal. However, the disclosure is not so limited and, in another example, the second conductive terminal can include a different metal or metallic alloy. Regardless, a metal that is included in or forms the second conductive terminal can be selected, for example, from Cu, W, Au, Ag, Pd, or other noble metals; or the like. In some implementations, the second conductive terminal can be formed by electroless plating of the second end with the metal. In other implementations, electrolytic plating can be utilized instead of electroless plating.

As described herein, formation of the first conductive terminal and the second conductive terminal can result in the formation of a capacitive interconnect.

At block 940, a first amount of solder material can be applied at the first conductive terminal. In some implementations, applying the first amount of solder material can include solder dipping the first conductive terminal and heating, via a reflow process, for example, the solder material adhered or otherwise attached to the to the first conductive terminal as a result of the dipping. In other implementations, applying the first amount of solder material can include printing a solder paste of the solder material on the first conductive terminal, and heating, via a reflow process, for example, the printed solder paste.

At block 950, a second amount of solder material can be applied at the second conductive terminal. In some implementations, applying the second amount of solder material can include solder dipping the second conductive terminal and heating, via a reflow process, for example, the solder material adhered or otherwise attached to the to the second conductive terminal as a result of the dipping. In other implementations, applying the second amount of solder material can include printing a solder paste of the solder material on the second conductive terminal, and heating, via a reflow process, for example, the printed solder paste.

Formation of the first solder electrode and the second solder electrode can result in the formation of a solder capacitive interconnect. At block 960, the solder capacitive interconnect can be assembled in a ball grid array. Assembling or otherwise placing the solder capacitive interconnect on the ball grid array can include aligning the capacitive interconnect on a surface of a board substrate (e.g., board substrate 130) in order to avoid short-circuiting the electrodes of the solder capacitive interconnect via a metallic pad of the board substrate (or a package substrate) onto which the solder capacitive interconnect is assembled.

Figure 10:
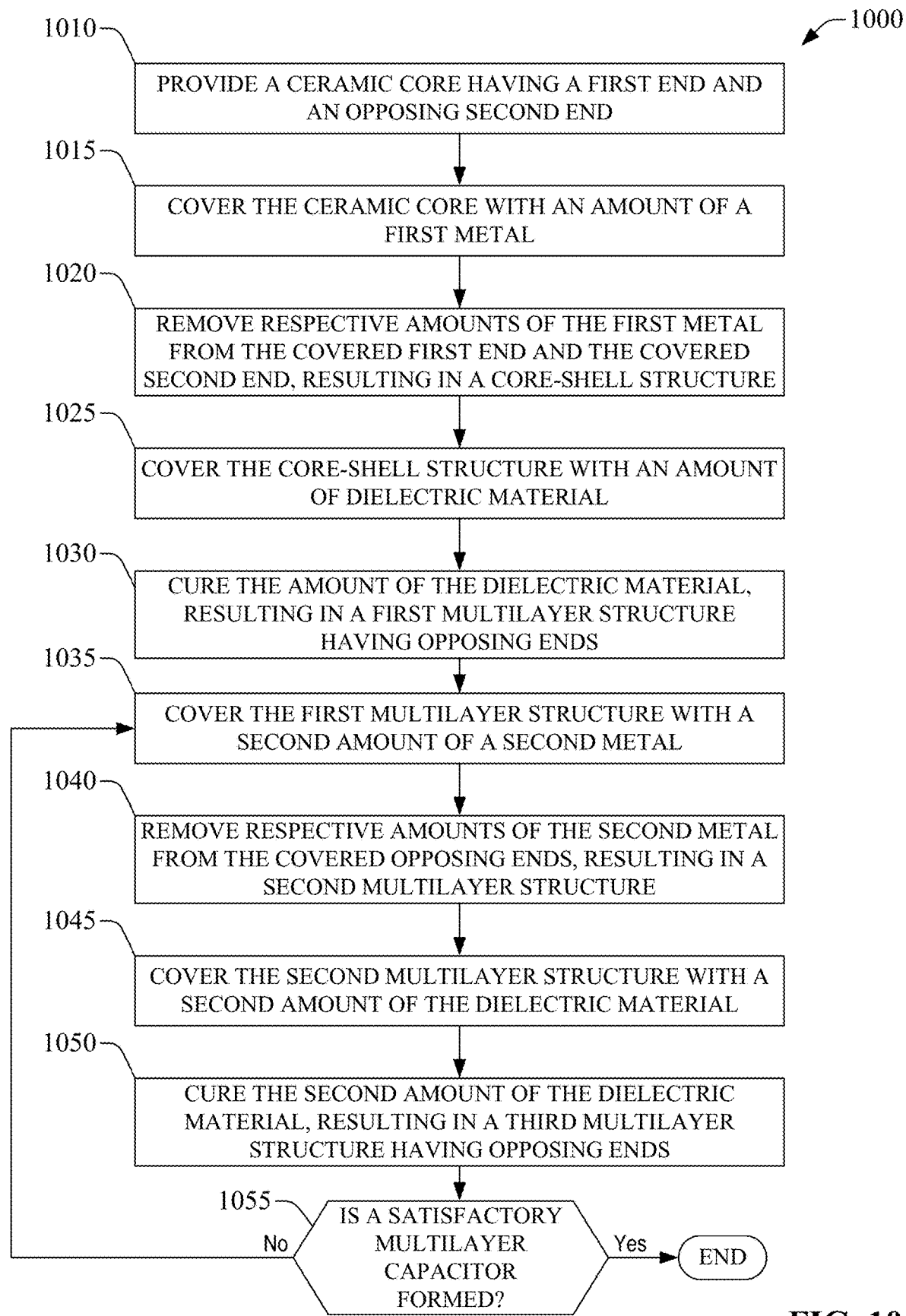
FIG. 10 illustrates an example of a method for fabricating a multilayer capacitor in accordance with one or more embodiments of the disclosure.

FIG. 10 illustrates an example of a method 1000 for fabricating a multilayer capacitor in accordance with one or more embodiments of the disclosure. At block 1010, a ceramic core having a first end and an opposing second end is provided. In some aspects, the ceramic core can be oblong and nearly cylindrically symmetric about a longitudinal axis (e.g., the elongation axis) of the core. In another aspect, a metal wire (e.g., a Ni wire, a Cu wire, or a W wire) pierces the core essentially along the longitudinal axis, extending directly from the first end to the second end. The metal wire also extends outward from the first end along the longitudinal axis, and further extends outward from the second end in an opposing direction along the longitudinal axis.

At block 1015, the ceramic core can be covered with an amount of a first metal (e.g., a simple metal, a noble metal, an alloy of two or more metals, or the like). Coverage of the ceramic core/element with the amount of the first metal can be accomplished by implementing any one or a combination of numerous metal deposition processes, including, for example, CVD (e.g., MOCVD, LPCVD, PECVD); ALD; PVD; sputtering; chemical solution deposition; plating (e.g., electroless plating or electrolytic plating); or the like. Accordingly, in some implementations, covering the ceramic core/element can include depositing the amount of the first metal by plating the ceramic core.

At block 1020, respective amounts of the first metal can be removed from the covered first end and the covered second end. Removing such amounts can result in a core-shell structure having a metal layer coating or otherwise covering the ceramic core. In some implementations, removing the respective amounts of the first metal can include selectively etching the first metal during a defined period. To that end, in one example, the covered first end and the covered second end can be immersed, in sequence, during a respective defined period, into a vat containing an etchant that can selectively remove the first metal (e.g., Cu, Al, W, Ag, Au, Pt, Pd, or the like).

At block 1025, the core-shell structure can be covered with an amount of dielectric material. As described herein, numerous dielectric materials can be utilized, including ceramics (such as those utilized in Class 1 and Class 2 capacitors), high-k dielectric materials, or a combination thereof. At block 1030, the amount of the dielectric material can be cured, resulting in a first multilayer structure that has a metal layer surrounding the ceramic core and a dielectric layer nearly concentrically abutting at least a portion of the metal layer. The curing can harden the dielectric material and, thus, can render the first multilayer structure mechanically stable. Curing the amount of the dielectric material can include annealing the covered core-shell structure at a defined temperature ranging from about 800° C. to about 1100° C.

At block 1035, the first multilayer structure can be covered with a second amount of a second metal. As described herein, in some implementations, covering the first multilayer structure can include depositing the second amount of the second metal by plating the first multilayer structure. The plating can include electroless plating or electrolytic plating. At block 1040, respective amounts of the second metal can be removed from the covered opposing ends of the first multilayer structure, resulting in a second multilayer structure that has a second metal layer nearly concentrically abutting at least a portion of the first multilayer structure.

At block 1045, the second multilayer structure can be covered with a second amount of the dielectric material. As described herein, covering the second multilayer structure with the second amount of the dielectric material can be accomplished by numerous deposition processes, including, for example, CVD, ALD, PVD, sputtering; chemical solution deposition; or the like. In some implementations, covering the second multilayer structure can include depositing the second amount of the dielectric material via sputtering. The plating can include electroless plating or electrolytic plating. At block 1050, the second amount of the dielectric material can be cured, resulting in a third multilayer structure having opposing ends. The third multilayer structure can include a second layer of dielectric nearly concentrically abutting at least a portion of the second multilayer structure. As such, in one aspect, the third multilayer can form or can constitute a capacitive structure.

At block 1055, it is determined if a satisfactory multilayer capacitor is formed by the successive formation of multilayer structures including dielectric-metal bilayers as described herein. To that end, in one aspect, determining that a satisfactory multilayer capacitor is formed can include applying a formation criterion, e.g., desired number of metal layers is formed, number of fabrication steps achieved, a combination of the foregoing, or the like, to a current solid structure that embodies a multilayer capacitor. In response to ascertaining that the satisfactory multilayer ball capacitor is not formed, the flow can be directed to block 1035 in order to form another metal-dielectric bilayer. In the alternative, in response to ascertaining that a satisfactory multilayer ball capacitor has been formed, the example method 1000 can end.

While not shown, in some embodiments, coverage of solid structures resulting from implementation of one or more blocks of the example method 1000 can be implemented in a manner that can bypass the implementation of block 1020 and/or 1040. Specifically, in some aspects, coverage of solid structure (e.g., the ceramic core, the core-shell structure, or a multilayer structure) with a metal or a dielectric material can be implemented in a manner that avoids the removal an amount of a metal. For instance, a solid structure can be controllably position to permit partial coverage with the metal and, thus, can avoid subsequent removal of a portion of the deposited metal.

According to example embodiments, the disclosure provides a semiconductor package. The semiconductor package can include a package substrate having a first surface and a second surface opposite to the first surface; solder balls configured to couple the package substrate to a board substrate, the solder balls in contact with respective first portions of the second surface; and a capacitor assembled adjacent to a solder ball of the solder balls, the capacitor having a first electrode and a second electrode, wherein the first electrode is coupled to a first portion of the second surface, the first electrode coupled to first metal layers, the second electrode coupled to second metal layers, and dielectric layers intercalated between the first metal layers and the second metal layers.

In addition or in some example embodiments, the the first electrode is in contact with a metal pad at the first portion of the second surface, the metal pad in electrical contact with a metal plane within the package substrate. Further or according to other example embodiments, the second electrode is in contact with a second metal pad at a second portion of a third surface of the board substrate, the second metal pad in electrical contact with a second metal plane within the board substrate, and wherein the metal plane is at a first voltage and the second metal plane is at a second voltage less than the first voltage.

In addition or in some example embodiments, a metal layer of the first metal layers can include copper, aluminum, tungsten, titanium, tantalum, silver, gold, palladium, platinum, zinc, nickel, or an alloy of two or more of the foregoing metals. Further or in other example embodiments, a metal layer of the second metal layers can include copper, aluminum, tungsten, titanium, tantalum, silver, gold, palladium, platinum, zinc, nickel, or an alloy of two or more of the foregoing metals. Further or in yet other embodiments, a dielectric layer of the dielectric layers comprises at least one of silicon oxide or a high-K material.

In addition or in some example embodiments, the first electrode can include a metal plate and an amount of solder material in contact with a top surface of the metal plate, and wherein the metal plate has a bottom surface in contact with the first metal layers. Further or in other example embodiments, the second electrode can include a second metal plate and a second amount of solder material in contact with a second top surface of the second metal plate, and wherein the second metal plate has a bottom surface in contact with the second metal layers.

In addition or in some embodiments, the capacitor and the solder ball can have substantially same height corresponding to a standoff between the second surface and the board substrate. Further or in some embodiments, the solder balls can be assembled in a portion of an array, and wherein the capacitor is assembled at one of a first location within the array or a second location within the array.

According to example embodiments, the disclosure can provide a capacitor. The capacitor can include, in some embodiments, one or more first metal layers; one or more second metal layers; one or more dielectric layers including a dielectric layer that intercalates a first metal layer of the one or more first metal layers and a second metal layer of the one or more second metal layers, the dielectric layer abutting the first metal layer and the second metal layer abutting the dielectric layer; a first electrode electrically coupled to the one or more first metal layers, the first electrode includes a first solder top; and a second electrode electrically coupled to the one or more second metal layers, the second electrode is opposite to the first electrode and includes a second solder top.

In addition or in some embodiments, the first electrode can include a first conductive plate in contact with at least one of the one or more first metal layers, and wherein the first solder top is in contact with a surface of the first conductive plate. Further or in other embodiments, the second electrode can include a second conductive plate in contact with at least one of the one or more second metal layers, and wherein the first solder top is in contact with a second surface of the second conductive plate.

In addition or in some embodiments, the first metal layer can include copper, aluminum, tungsten, titanium, tantalum, silver, gold, palladium, platinum, zinc, nickel, or an alloy of two or more of the foregoing metals, and wherein second metal layer comprises copper, aluminum, tungsten, titanium, tantalum, silver, gold, palladium, platinum, zinc, nickel, or an alloy of two or more of the foregoing metals. Further or in other embodiments, the dielectric layer can include at least one of silicon oxide, alumina, silicon monoxide, silicon dioxide, titanium dioxide, silicon nitride, an alkali halide, lithium fluoride, barium titanate, lead titanate, hafnium dioxide, tantalum oxide, tungsten oxide, and zirconium dioxide.

According to example embodiments, the disclosure can provide a method. The method can include, in some embodiments, providing a multilayer capacitor having a first end and an opposing second end; forming a first conductive terminal at the first end; forming a second conductive terminal at the second end, resulting in a capacitive interconnect; applying a first amount of solder material at the first conductive terminal; and applying a second amount of solder material at the second conductive terminal, resulting in a solder capacitive interconnect.

In addition or in other embodiments, the method can include assembling the solder capacitive interconnect in a ball grid array in a semiconductor package. Further or in some embodiments, forming the first conductive terminal at the first end can include electroplating an amount of a metal onto a surface of the first end; and wherein forming the second conductive terminal at the second end can include electroplating a second amount of the metal onto a second surface of the second end.

In addition or in other embodiments, applying a first amount of solder material at the first conductive terminal can include dipping a portion of the capacitive interconnect into a molten lead-tin eutectic alloy or a molten lead-free eutectic alloy; and wherein applying the second amount of solder material at the second conductive terminal can include dipping a second portion of the capacitive interconnect into the molten lead-tin eutectic alloy or the molten lead-free eutectic alloy.

In addition or in other embodiments, providing a multilayer capacitor having a first end and an opposing second end can include providing a multilayer ceramic capacitor. Further or in other embodiments, the providing can include providing a ceramic core having a first end and an opposing second end; and covering the ceramic core with an amount of a first metal. Furthermore or in other embodiments, the providing can further include removing respective amounts of the first metal from the covered first end and the covered second end, resulting in a core-shell structure; covering the core-shell structure with an amount of dielectric material; and curing the amount of the dielectric material, resulting in a first multilayer structure having opposing ends.

In addition or in other embodiments, providing a multilayer capacitor having a first end and an opposing second end can further include covering the first multilayer with a second amount of a second metal; removing respective amounts of the second metal from the covered opposing end, resulting in a second multilayer structure; covering the second multilayer structure with a second amount of the dielectric material; and curing the second amount of the dielectric material, resulting in a third multilayer structure having opposing ends.

In addition or in other embodiments, providing a multilayer capacitor having a first end and an opposing second end can further include determining that the multilayer capacitor is not formed; and forming an additional multilayer structure having opposing end, the additional multilayer structure comprising a layer of dielectric material and a layer of metal, the layer of dielectric material abutting the layer of metal.

In addition or in other embodiments, providing a multilayer capacitor having a first end and an opposing second end can further include determining that the multilayer capacitor is formed based on one or more fabrication criteria.

In addition or according to example embodiments, the disclosure can provide a device. The device can include, for example, a package substrate having a first surface and a second surface opposite to the first surface; solder balls that couple the package substrate to a board substrate, the solder balls in contact with respective first portions of the second surface and further in contact with respective second portions of a third surface of the board substrate; and a capacitor assembled adjacent to a solder ball of the solder balls, the capacitor having a first electrode coupled to a first portion of the second surface and a second electrode coupled to a second portion of the third surface, the first electrode coupled to first metal layers, the second electrode coupled to second metal layers, and dielectric layers intercalated between the first metal layers and the second metal layers.

In addition or in some embodiments, the first electrode can be in contact with a metal pad at the first portion of the second surface, the metal pad in electrical contact with a metal plane within the board substrate. Further or in some embodiments, the second electrode is in contact with a second metal pad at the second portion of the third surface, the second metal pad in electrical contact with a second metal plane within the board substrate, and wherein the metal plane is at a first voltage and the second metal plane is at a second voltage less than the first voltage.

In addition or in some embodiments, a metal layer of the first metal layers comprises copper, aluminum, tungsten, titanium, tantalum, silver, gold, palladium, platinum, zinc, nickel, or an alloy of two or more of the foregoing metals. Further or in some embodiments, a metal layer of the second metal layers comprises copper, aluminum, tungsten, titanium, tantalum, silver, gold, palladium, platinum, zinc, nickel, or an alloy of two or more of the foregoing metals. Furthermore or in other embodiments, a dielectric layer of the dielectric layers comprises at least one of a silicon oxide or a high-K material.

In addition or in some embodiments, the first electrode comprises a metal plate and an amount of solder material in contact with a top surface of the metal plate, and wherein the metal plate has a bottom surface in contact with the first metal layers. Further or in some embodiments, the second electrode comprises a second metal plate and a second amount of solder material in contact with a second top surface of the second metal plate, and wherein the second metal plate has a bottom surface in contact with the second metal layers.

In addition or in some embodiments, the capacitor and the solder ball can have substantially same height corresponding to a standoff between the second surface and the third surface. Further or in some embodiments, the solder balls can be assembled in a portion of an array, and wherein the capacitor is assembled at one of a first location within the array or a second location within the array.

According to example embodiments, the disclosure can provide a system. The system can include, in some embodiments, a semiconductor die having circuitry fabricated thereon, the semiconductor die mounted on a package substrate having a first surface and a second surface opposite to the first surface; a board substrate having the package substrate mounted thereon; conductive interconnects that couple the package substrate to the board substrate, the conductive interconnects in contact with respective first metallic pads at the second surface and further in contact with respective second metallic pads of a third surface of the board substrate; and a capacitive interconnect adjacent to a conductive interconnect of the conductive interconnects, the capacitive interconnect having a first electrode coupled to a first metallic pad of the second surface and a second electrode coupled to a second metallic pad of the third surface, the first electrode coupled to first metal layers, the second electrode coupled to second metal layers, and dielectric layers intercalated between the first metal layers and the second metal layers.

In addition or in some embodiments, the first electrode can be in contact with the first metallic pad, the first metallic pad in electrical contact with a metal plate within the board substrate. Further or in some example embodiments the second electrode can be in contact with the second metallic pad, the second metallic pad in electrical contact with a second metal plate within the board substrate, and wherein the metal plate is at a first voltage and the second metal plate is at a second voltage less than the first voltage.

In addition or in some embodiments, a metal layer of the first metal layers can include copper, aluminum, tungsten, titanium, tantalum, silver, gold, palladium, platinum, zinc, nickel, or an alloy of two or more of the foregoing metals. Further or in some embodiments, a metal layer of the second metal layers can include copper, aluminum, tungsten, titanium, tantalum, silver, gold, palladium, platinum, zinc, nickel, or an alloy of two or more of the foregoing metals. Furthermore or in some embodiments, a dielectric layer of the dielectric layers comprises at least one of silicon oxide or a high-K material.

In addition or in other embodiments, the first electrode can include a metal plate and an amount of solder material in contact with a top surface of the metal plate, and wherein the metal plate can have a bottom surface in contact with the first metal layers. Further or in other embodiments, the second electrode can include a second metal plate and a second amount of solder material in contact with a second top surface of the second metal plate, and wherein the second metal plate can have a bottom surface in contact with the second metal layers.

In addition or in other embodiments, the capacitive interconnect and the conductive interconnect each can have a height corresponding to a standoff between the second surface and the third surface. Further or in some embodiments, the conductive interconnects can be assembled in a portion of an array, and wherein the capacitive interconnect is assembled at one of a first location within the array or a second location within the array.

As mentioned, unless otherwise expressly stated, it is in no way intended that any protocol, procedure, process, or method set forth herein be construed as requiring that its acts or steps be performed in a specific order. Accordingly, where a process or method claim does not actually recite an order to be followed by its acts or steps or it is not otherwise specifically recited in the claims or descriptions of the subject disclosure that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification or annexed drawings, or the like.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language generally is not intended to imply that features, elements, and/or operations are in any way required for one or more implementations or that one or more implementations necessarily include logic for deciding, with or without user input or prompting, whether these features, elements, and/or operations are included or are to be performed in any particular implementation.

The term "horizontal" as used herein may be defined as a direction parallel to a plane or surface (e.g., surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to the horizontal plane. The term "processing" as used herein is generally intended to include deposition of material or photoresist, patterning, exposure, development, etching, cleaning, ablating, polishing, and/or removal of the material or photoresist as required in forming a described structure.

What has been described herein in the present specification and annexed drawings includes examples of solder capacitive interconnects and techniques that can provide such interconnects. It is, of course, not possible to describe every conceivable combination of elements and/or methodologies for purposes of describing the various features of the disclosure, but one of ordinary skill in the art can recognize that many further combinations and permutations of the claimed subject matter are possible. Accordingly, it may be apparent that various modifications can be made to the disclosure without departing from the scope or spirit thereof. In addition or in the alternative, other embodiments of the disclosure may be apparent from consideration of the specification and annexed drawings, and practice of the disclosure as presented herein. It is intended that the examples put forward in the specification and annexed drawings be considered, in all respects, as illustrative and not restrictive. Although specific terms are employed herein, they are used in a generic and descriptive sense only and not for purposes of limitation.

What is claimed is:

1. A semiconductor package, comprising:
   a package substrate having a first surface and a second surface opposite to the first surface;
   solder balls configured to couple the package substrate to a board substrate, the solder balls in contact with respective first portions of the second surface;
   a capacitor assembled adjacent to a solder ball of the solder balls, the capacitor having a first electrode and a second electrode, wherein the first electrode is coupled to a second portion of the second surface, the first electrode coupled to first metal layers, the second electrode coupled to second metal layers, and dielectric layers intercalated between the first metal layers and the second metal layers;
   wherein a first amount of a metal is electroplated onto a surface of the first electrode to form a first conductive terminal, and a second amount of a metal is electroplated onto a surface of the second electrode to form a second conductive terminal; and
   wherein the capacitor comprises a ceramic core having a first end and an opposing second end, and wherein the ceramic core is covered with an amount of a metal layer of the first metal layers or an amount of a metal layer of the second metal layers.

2. The semiconductor package of claim 1, wherein the first electrode is in contact with a metal pad at the second portion of the second surface, the metal pad in electrical contact with a metal plane within the package substrate.

3. The semiconductor package of claim 2, wherein the second electrode is in contact with a second metal pad at a second portion of a third surface of the board substrate, the second metal pad in electrical contact with a second metal plane within the board substrate, and wherein the metal plane is at a first voltage and the second metal plane is at a second voltage less than the first voltage.

4. The semiconductor package of claim 1, wherein the metal layer of the first metal layers comprises copper, aluminum, tungsten, titanium, tantalum, silver, gold, palladium, platinum, zinc, nickel, or an alloy of two or more of the foregoing metals.

5. The semiconductor package of claim 4, wherein the second conductive terminal comprises a second metal plate and a second amount of solder material in contact with a second top surface of the second metal plate, and wherein the second metal plate has a bottom surface in contact with the second metal layers.

6. The semiconductor package of claim 1, wherein the metal layer of the second metal layers comprises copper, aluminum, tungsten, titanium, tantalum, silver, gold, palladium, platinum, zinc, nickel, or an alloy of two or more of the foregoing metals.

7. The semiconductor package of claim 1, wherein a dielectric layer of the dielectric layers comprises at least one of silicon oxide or a high-K material.

8. The semiconductor package of claim 1, wherein the first conductive terminal comprises a metal plate and an amount of solder material in contact with a top surface of the metal plate, and wherein the metal plate has a bottom surface in contact with the first metal layers.

9. The semiconductor package of claim 1, wherein the capacitor and the solder ball have substantially same height corresponding to a standoff between the second surface and the board substrate.

10. The semiconductor package of claim 1, wherein the solder balls are assembled in a portion of an array, and wherein the capacitor is assembled at one of a first location within the array or a second location within the array.

11. A capacitor, comprising:
    one or more first metal layers;
    one or more second metal layers;
    one or more dielectric layers including a dielectric layer that intercalates a first metal layer of the one or more first metal layers and a second metal layer of the one or more second metal layers, the dielectric layer abutting the first metal layer and the second metal layer abutting the dielectric layer;
    a first electrode electrically coupled to the one or more first metal layers, the first electrode includes a first solder top;
    a second electrode electrically coupled to the one or more second metal layers, the second electrode is opposite to the first electrode and includes a second solder top;
    wherein a first amount of a metal is electroplated onto a surface of the first electrode to form a first conductive terminal, and a second amount of a metal is electroplated onto a surface of the second electrode to form a second conductive terminal; and wherein the capacitor further comprises a ceramic core having a first end and an opposing second end, and wherein the ceramic core is covered with an amount of the one or more first metal layers or an amount of the one or more second metal layers.

12. The capacitor of claim 11, wherein the first conductive terminal comprises a first conductive plate in contact with at least one of the one or more first metal layers, and wherein the first solder top is in contact with a surface of the first conductive plate.

13. The capacitor of claim 12, wherein the second conductive terminal comprises a second conductive plate in contact with at least one of the one or more second metal layers, and wherein the second solder top is in contact with a second surface of the second conductive plate.

14. The capacitor of claim 11, wherein the first metal layer comprises copper, aluminum, tungsten, titanium, tantalum, silver, gold, palladium, platinum, zinc, nickel, or an alloy of two or more of the foregoing metals, and wherein second metal layer comprises copper, aluminum, tungsten, titanium, tantalum, silver, gold, palladium, platinum, zinc, nickel, or an alloy of two or more of the foregoing metals.

15. The capacitor of claim 11, wherein the dielectric layer comprises at least one of silicon oxide, alumina, silicon monoxide, silicon dioxide, titanium dioxide, silicon nitride, an alkali halide, lithium fluoride, barium titanate, lead titanate, hafnium dioxide, tantalum oxide, tungsten oxide, and zirconium dioxide.

16. A method, comprising:
providing a multilayer capacitor having a first end and an opposing second end;
forming a first conductive terminal at the first end;
forming a second conductive terminal at the second end, resulting in a capacitive interconnect;
applying a first amount of solder material at the first conductive terminal;
applying a second amount of solder material at the second conductive terminal, resulting in a solder capacitive interconnect;
wherein forming the first conductive terminal at the first end comprises electroplating an amount of a metal onto a surface of the first end;
wherein forming the second conductive terminal at the second end comprises electroplating a second amount of the metal onto a second surface of the second end; and
wherein providing the multilayer capacitor comprises providing a ceramic core having a first end and an opposing second end; and
covering the ceramic core with an amount of a first metal.

17. The method of claim 16, further comprising assembling the solder capacitive interconnect in a ball grid array in a semiconductor package.

18. The method of claim 16, wherein the applying a first amount of solder material at the first conductive terminal comprises dipping a portion of the capacitive interconnect into a molten lead-tin eutectic alloy or a molten lead-free eutectic alloy; and wherein the applying the second amount of solder material at the second conductive terminal comprises dipping a second portion of the capacitive interconnect into the molten lead-tin eutectic alloy or the molten lead-free eutectic alloy.

19. The method of claim 16, wherein providing the multilayer capacitor comprises providing a multilayer ceramic capacitor.

20. The method of claim 16, wherein the providing further comprises removing respective amounts of the first metal from the covered first end of the ceramic core and the covered second end of the ceramic core, resulting in a core-shell structure;
covering the core-shell structure with an amount of dielectric material; and
curing the amount of the dielectric material, resulting in a first multilayer structure having opposing ends.

21. The method of claim 20, wherein the providing further comprises covering the first multilayer structure with a second amount of a second metal;
removing respective amounts of the second metal from the covered opposing ends of the first multilayer structure, resulting in a second multilayer structure;
covering the second multilayer structure with a second amount of the dielectric material; and
curing the second amount of the dielectric material, resulting in a third multilayer structure having opposing ends.

22. The method of claim 21, wherein the providing further comprises determining that the multilayer capacitor is not formed; and
forming an additional multilayer structure having opposing ends, the additional multilayer structure comprising a layer of the dielectric material and a layer of a third metal, the layer of the dielectric material abutting the layer of the third metal, wherein the layer of the third metal covers at least a portion of the third multilayer structure.

* * * * *